(12) United States Patent
Senesac

(10) Patent No.: US 10,061,481 B2
(45) Date of Patent: Aug. 28, 2018

(54) METHODS AND DEVICES FOR VISUALLY QUERYING AN AIRCRAFT BASED ON AN AREA OF AN IMAGE

(71) Applicant: The Boeing Company, Chicago, IL (US)

(72) Inventor: Christopher J. Senesac, Daniel Island, SC (US)

(73) Assignee: The Boeing Company, Chicago, IL (US)

( * ) Notice: Subject to any disclaimer, the term of this patent is extended or adjusted under 35 U.S.C. 154(b) by 1124 days.

(21) Appl. No.: 13/780,109

(22) Filed: Feb. 28, 2013

(65) Prior Publication Data

US 2014/0245206 A1 Aug. 28, 2014

(51) Int. Cl.
*G06F 3/0484* (2013.01)
*G06F 17/50* (2006.01)
*G06Q 50/04* (2012.01)
*B64F 5/10* (2017.01)

(52) U.S. Cl.
CPC .............. *G06F 3/0484* (2013.01); *B64F 5/10* (2017.01); *G06F 17/5095* (2013.01); *G06Q 50/04* (2013.01); *Y02P 90/30* (2015.11)

(58) Field of Classification Search
None
See application file for complete search history.

(56) References Cited

U.S. PATENT DOCUMENTS

| | | | |
|---|---|---|---|
| 3,744,917 A | 7/1973 | Craig | |
| 4,815,190 A | 3/1989 | Haba et al. | |
| 4,894,908 A | 1/1990 | Haba et al. | |
| 5,023,805 A | 6/1991 | Aune | |
| 5,367,552 A | 11/1994 | Peschmann | |
| 5,544,558 A | 8/1996 | Hughes | |
| 5,771,043 A | 6/1998 | Nigawara et al. | |
| 5,822,218 A | 10/1998 | Moosa et al. | |
| 5,960,104 A | 9/1999 | Conners | |
| 6,000,610 A * | 12/1999 | Talbott | B42D 15/00 186/52 |
| 6,167,394 A | 12/2000 | Leung et al. | |
| 6,240,328 B1 * | 5/2001 | LaLonde et al. | 700/95 |

(Continued)

FOREIGN PATENT DOCUMENTS

| | | |
|---|---|---|
| CN | 1609852 A | 4/2005 |
| CN | 1983268 A | 6/2006 |

(Continued)

OTHER PUBLICATIONS

Non-Patent Literature including images from the website www.aso.com, as published on Jan. 16, 2013 based on captures in the Internet Archive tool referred to as the WayBackMachine, http://web.archive.org/web/20130116040904/http://www.aso.com/ ("NPL1").*

(Continued)

*Primary Examiner* — Taghi Arani
*Assistant Examiner* — Farshad Far-Hadian
(74) *Attorney, Agent, or Firm* — Yee & Associates, P.C.

(57) ABSTRACT

A method and apparatus for visually querying an aircraft. A model is identified for the aircraft. Sections of the aircraft are displayed in a graphical user interface on a display device. The sections correspond to sections as manufactured for assembly of the aircraft. The sections are selectable.

15 Claims, 12 Drawing Sheets

(56) References Cited

U.S. PATENT DOCUMENTS

| | | | |
|---|---|---|---|
| 6,345,207 B1 | 2/2002 | Nitta et al. | |
| 6,378,387 B1 | 4/2002 | Froom | |
| 6,381,509 B1 | 4/2002 | Thiel et al. | |
| 6,418,189 B1 | 7/2002 | Schafer | |
| 6,477,471 B1 | 11/2002 | Hedstrom et al. | |
| 6,481,096 B2 | 11/2002 | Lehmker | |
| 6,487,479 B1 | 11/2002 | Nelson | |
| 6,597,761 B1 | 7/2003 | Garms, III | |
| 6,604,681 B1* | 8/2003 | Burke | B62B 3/1424 235/379 |
| 6,637,266 B1 | 10/2003 | Froom | |
| 6,912,507 B1* | 6/2005 | Phillips | G06Q 10/06311 705/22 |
| 6,941,204 B2 | 9/2005 | Halm | |
| 7,042,346 B2 | 5/2006 | Paulsen | |
| 7,050,894 B2 | 5/2006 | Halm et al. | |
| 7,103,434 B2 | 9/2006 | Chernyak | |
| 7,167,583 B1 | 1/2007 | Lipson et al. | |
| 7,302,443 B2* | 11/2007 | Nakajima et al. | |
| 7,333,991 B2* | 2/2008 | Hill et al. | |
| 7,343,213 B1 | 3/2008 | Burgess | |
| 7,353,192 B1* | 4/2008 | Ellis et al. | 705/26.5 |
| 7,365,747 B2 | 4/2008 | Finlayson et al. | |
| 7,366,688 B2* | 4/2008 | Kwasniewski et al. | 705/26.5 |
| 7,644,371 B2 | 1/2010 | Robertson et al. | |
| 7,646,384 B2 | 1/2010 | Anderson et al. | |
| 7,650,202 B2 | 1/2010 | Strohband et al. | |
| 7,804,498 B1 | 9/2010 | Graham et al. | |
| 7,933,441 B2 | 4/2011 | Numata | |
| 7,954,070 B2* | 5/2011 | Plocher | G08B 25/14 700/13 |
| 8,027,745 B1* | 9/2011 | Freeze | 700/106 |
| 8,051,547 B2 | 11/2011 | Toh | |
| 8,079,130 B2 | 12/2011 | Hardouin-Finez | |
| 8,116,529 B2 | 2/2012 | Edwards | |
| 8,352,904 B2 | 1/2013 | Hodges | |
| 8,482,412 B2 | 7/2013 | Majoros et al. | |
| 8,527,348 B2* | 9/2013 | Petrov | G06Q 10/087 705/14.64 |
| 8,571,951 B2 | 10/2013 | Diana et al. | |
| 8,606,540 B2 | 12/2013 | Haisty et al. | |
| 8,610,761 B2 | 12/2013 | Haisty et al. | |
| 8,620,627 B2* | 12/2013 | Nakhle et al. | 703/1 |
| 8,791,823 B2 | 7/2014 | Xu | |
| 8,849,636 B2 | 9/2014 | Becker | |
| 8,860,760 B2 | 10/2014 | Chen | |
| 8,914,149 B2 | 12/2014 | Safa-Bakhsh et al. | |
| 9,488,592 B1 | 11/2016 | Maresca et al. | |
| 2002/0007225 A1 | 1/2002 | Costello et al. | |
| 2002/0026296 A1 | 2/2002 | Lohmann | |
| 2002/0071524 A1 | 7/2002 | Renkart | |
| 2002/0168083 A1 | 11/2002 | Garms | |
| 2002/0198764 A1 | 12/2002 | Schorno | |
| 2003/0055619 A1 | 3/2003 | Singarajan | |
| 2003/0055812 A1* | 3/2003 | Williams et al. | 707/1 |
| 2003/0083794 A1 | 5/2003 | Halm | |
| 2003/0120472 A1* | 6/2003 | Lind | 703/13 |
| 2003/0149500 A1 | 8/2003 | Faruque | |
| 2003/0158702 A1 | 8/2003 | Busche et al. | |
| 2004/0090472 A1 | 5/2004 | Risch et al. | |
| 2004/0093100 A1 | 5/2004 | Gleis | |
| 2004/0098151 A1 | 5/2004 | Carlucci et al. | |
| 2004/0128117 A1 | 7/2004 | Crandall | |
| 2004/0162651 A1 | 8/2004 | Halm | |
| 2005/0044011 A1* | 2/2005 | Deal | G06Q 30/0603 705/26.9 |
| 2005/0149216 A1 | 7/2005 | Popplewell | |
| 2005/0223032 A1 | 10/2005 | Shan et al. | |
| 2005/0228708 A1 | 10/2005 | Catala et al. | |
| 2005/0278062 A1* | 12/2005 | Janert et al. | 700/214 |
| 2006/0106682 A1* | 5/2006 | Van Dyck | G06Q 30/02 705/26.5 |
| 2006/0119601 A1 | 6/2006 | Finlayson et al. | |
| 2007/0013709 A1 | 1/2007 | Charles et al. | |
| 2007/0106410 A1 | 5/2007 | Bouffiou et al. | |
| 2007/0106414 A1 | 5/2007 | Strohband et al. | |
| 2007/0219645 A1* | 9/2007 | Thomas | G05B 15/02 700/29 |
| 2008/0052046 A1 | 2/2008 | Botvinnik | |
| 2008/0140270 A1* | 6/2008 | Davis et al. | 701/8 |
| 2008/0187897 A1 | 8/2008 | Franzen et al. | |
| 2008/0205763 A1 | 8/2008 | Marsh et al. | |
| 2008/0209342 A1* | 8/2008 | Taylor | G05B 15/02 715/747 |
| 2008/0234850 A1 | 9/2008 | Bowling et al. | |
| 2008/0252311 A1 | 10/2008 | Koh et al. | |
| 2008/0270946 A1 | 10/2008 | Risch et al. | |
| 2008/0276201 A1 | 11/2008 | Risch et al. | |
| 2008/0294395 A1* | 11/2008 | Lu | G05B 19/41885 703/2 |
| 2008/0301012 A1 | 12/2008 | Cogswell et al. | |
| 2009/0013281 A1 | 1/2009 | Helman et al. | |
| 2009/0031236 A1 | 1/2009 | Roberston et al. | |
| 2009/0112349 A1 | 4/2009 | Cobb | |
| 2009/0138230 A1* | 5/2009 | Davies | G06F 3/04815 702/150 |
| 2009/0144962 A1 | 7/2009 | Hardouin-Finez | |
| 2009/0192644 A1 | 7/2009 | Meyer et al. | |
| 2009/0228133 A1 | 9/2009 | Loda | |
| 2009/0248545 A1 | 10/2009 | Robinson et al. | |
| 2009/0312897 A1 | 12/2009 | Jamrosz et al. | |
| 2010/0010794 A1 | 1/2010 | Sweers | |
| 2010/0097195 A1 | 4/2010 | Majoros et al. | |
| 2010/0114641 A1 | 5/2010 | Coffman et al. | |
| 2010/0125468 A1 | 5/2010 | Avery et al. | |
| 2010/0161095 A1* | 6/2010 | Lindgren | G06F 17/5095 700/98 |
| 2010/0175013 A1 | 7/2010 | Krauter et al. | |
| 2010/0299304 A1 | 11/2010 | Vasudevan | |
| 2011/0022208 A1 | 1/2011 | Bouffiou et al. | |
| 2011/0041088 A1* | 2/2011 | Mason | G06F 3/04817 715/767 |
| 2011/0046763 A1 | 2/2011 | Tsuchiya et al. | |
| 2011/0087466 A1 | 4/2011 | Vossmann | |
| 2011/0087513 A1 | 4/2011 | Floyd et al. | |
| 2011/0125303 A1 | 5/2011 | Rollman et al. | |
| 2011/0137443 A1 | 6/2011 | Farahani | |
| 2011/0166824 A1 | 7/2011 | Hasity et al. | |
| 2011/0169924 A1* | 7/2011 | Haisty | H04N 9/3147 348/51 |
| 2011/0172795 A1 | 7/2011 | Hansen et al. | |
| 2011/0251711 A1 | 10/2011 | Goel | |
| 2011/0288840 A1 | 11/2011 | Kropinski et al. | |
| 2011/0311097 A1 | 12/2011 | Kitagawa et al. | |
| 2012/0007852 A1 | 1/2012 | Morate et al. | |
| 2012/0030926 A1 | 2/2012 | Toh et al. | |
| 2012/0050522 A1 | 3/2012 | Slyck et al. | |
| 2012/0062725 A1 | 3/2012 | Charles et al. | |
| 2012/0071998 A1* | 3/2012 | Davies et al. | 700/98 |
| 2012/0075343 A1 | 3/2012 | Chen et al. | |
| 2012/0100520 A1* | 4/2012 | Jo et al. | 434/365 |
| 2012/0130521 A1* | 5/2012 | Kohlhoff | 700/98 |
| 2012/0140041 A1 | 6/2012 | Burgunder et al. | |
| 2012/0154265 A1 | 6/2012 | Kim et al. | |
| 2012/0249588 A1 | 10/2012 | Tison et al. | |
| 2012/0303336 A1* | 11/2012 | Becker et al. | 703/1 |
| 2012/0304059 A1 | 11/2012 | McCloskey | |
| 2012/0306666 A1* | 12/2012 | Xu et al. | 340/945 |
| 2013/0006409 A1 | 1/2013 | Evans et al. | |
| 2013/0036031 A1 | 2/2013 | Hutchinson et al. | |
| 2013/0117742 A1 | 5/2013 | Newell | |
| 2013/0124150 A1 | 5/2013 | Kim et al. | |
| 2013/0132373 A1* | 5/2013 | Huang et al. | 707/722 |
| 2013/0239330 A1 | 9/2013 | Newlin et al. | |
| 2013/0261876 A1 | 10/2013 | Froom | |
| 2013/0297633 A1 | 11/2013 | Edwards | |
| 2014/0013263 A1* | 1/2014 | Bailiang | G09B 29/106 715/771 |
| 2014/0089030 A1* | 3/2014 | Bell | G06Q 10/06313 705/7.23 |

(56) References Cited

U.S. PATENT DOCUMENTS

| | | | |
|---|---|---|---|
| 2014/0245206 A1* | 8/2014 | Senesac | 715/771 |
| 2015/0062123 A1 | 3/2015 | Yuen | |
| 2015/0134274 A1 | 5/2015 | Froom | |

FOREIGN PATENT DOCUMENTS

| | | |
|---|---|---|
| CN | 101329624 A | 12/2008 |
| CN | 104102969 A | 10/2014 |
| DE | 102005005266 A1 | 8/2006 |
| EP | 1321869 A2 | 6/2003 |
| EP | 2052807 A1 | 4/2009 |
| EP | 2431915 A2 | 3/2012 |
| EP | 2458562 A1 | 5/2012 |
| EP | 2790136 A1 | 10/2014 |
| GB | 2327289 A | 1/1999 |
| JP | H10254941 A | 9/1998 |
| JP | H10269292 A | 10/1998 |
| JP | 2004206352 A | 7/2004 |
| JP | 2007095039 A | 4/2007 |
| JP | 2008288852 A | 11/2008 |
| JP | 201153999 A1 | 9/2011 |
| JP | 2012039544 A | 2/2012 |
| JP | 2012104124 A | 5/2012 |
| JP | 2012526979 A | 11/2012 |
| JP | 2013505637 A | 2/2013 |
| WO | WO0049544 A2 | 8/2000 |
| WO | WO2008143148 A1 | 11/2008 |
| WO | WO2008144797 A1 | 12/2008 |
| WO | WO2011056196 A1 | 5/2011 |
| WO | WO2012166545 A2 | 12/2012 |
| WO | WO2013061156 A2 | 5/2013 |
| WO | WO2013078156 A1 | 5/2013 |
| WO | WO2013078265 A1 | 5/2013 |

OTHER PUBLICATIONS

Gass et al., "Locator System for Three-Dimensional Visualization," U.S. Appl. No. 13/855,102, filed Apr. 2, 2013, 87 pages.
Senesac et al., "Condition of Assembly Visualization System Based on Build Cycles," U.S. Appl. No. 13/835,262, filed Mar. 15, 2013, 79 pages.
Senesac et al., "Shop Order Status Visualization System," U.S. Appl. No. 13/785,616, filed Mar. 5, 2013, 98 pages.
Senesac, "Condition of Assembly Visualization System," U.S. Appl. No. 13/834,893, filed Mar. 15, 2013, 73 pages.
Senesac, "Nonconformance Visualization System," U.S. Appl. No. 13/798,964, filed Mar. 13, 2013, 84 pages.
Senesac, "Shop Order Status Visualization System," U.S. Appl. No. 13/858,364, filed Apr. 8, 2013, 108 pages.
Senesac et al., "Aircraft Comparison System," U.S. Appl. No. 13/860,126, filed Apr. 10, 2013, 103 pages.
Senesac et al., "Nonconformance Visualization System," U.S. Appl. No. 13/861,678, filed Apr. 12, 2013, 116 pages.
Senesac, "Shop Order Status Visualization System," U.S. Appl. No. 13/890,347, filed May 9, 2013, 96 pages.
Prazak et al., "Visualization of an Object Using a Visual Query System," U.S. Appl. No. 13/852,063, filed Mar. 28, 2013, 50 pages.
Senesac et al., "Aircraft Comparison System with Synchronized Displays," U.S. Appl. No. 13/921,411, filed Jun. 20, 2013, 120 pages.
Senesac, "Serial Number Control Visualization System," U.S. Appl. No. 14/467,706, filed Aug. 25, 2014, 113.
Extended European Search Report, dated Jul. 17, 2014, regarding Application No. 14162481.7, 5 pages.
Extended European Search Report, dated Jul. 23, 2014, regarding Application No. 14157597.7, 7 pages.
Extended European Search Report, dated Aug. 22, 2014, regarding Application No. EP14159832.6, 9 pages.
International Search Report and Written Opinion, dated Apr. 25, 2014, regarding Application No. PCT/US2014/010912, 10 pages.
Extended European Search Report, dated Jun. 2, 2014, regarding Application No. 14160787.9, 6 pages.
"Notice from the European Patent Office dated Oct. 1, 2007 concerning business methods," Official Journal EPO, Nov. 2007, pp. 592-593.
Office Action, dated May 5, 2015, regarding U.S. Appl. No. 13/861,678, 48 pages.
"Marianna Airmotive Uses a FARO Laser Tracker to Reduce Repair Turnaround Time dramatically," Mar. 7, 2015, 2 pages. http://www.mariannaairmotive.com.
"What's New in SolidWorks," SolidWorks, Version 2010, 199 pages. http://files.solidworks.com/Supportfiles/Whats_new/2010/English/whatsnew.pdf.
Office Action, dated May 6, 2015, regarding U.S. Appl. No. 13/852,063, 39 pages.
Office Action, dated Feb. 26, 2015, regarding U.S. Appl. No. 13/858,364, 32 pages.
Notice of Allowance, dated Apr. 13, 2015, regarding U.S. Appl. No. 13/858,364, 5 pages.
Office Action, dated Feb. 27, 2015, regarding U.S. Appl. No. 13/834,893, 41 pages.
Office Action, dated Mar. 4, 2015, regarding U.S. Appl. No. 13/855,102, 28 pages.
Office Action, dated Apr. 12, 2015, regarding U.S. Appl. No. 13/798,964, 39 pages.
Extended European Search Report, dated Sep. 30, 2014, regarding Application No. EP14159760.9, 6 pages.
International Search Report and Written Opinion, dated Nov. 19, 2014, regarding Application No. PCT/US2014/011196, 10 pages.
International Search Report and Written Opinion, dated Dec. 1, 2014, regarding Application No. PCT/US2014/031030, 9 pages.
Extended European Search Report, dated Dec. 3, 2014, regarding Application No. 14170988.1, 7 pages.
Australian Government Patent Examination Report No. 1, dated Mar. 18, 2015, regarding Application No. 2014200514, 4 pages.
Candadian Intellectual Property Office Examination Search Report, dated Mar. 24, 2015, regarding Application No. 2,840,798, 6 pages.
Australian Government Patent Examination Report No. 1, dated Mar. 27, 2015, regarding Application No. 2014200292, 3 pages.
Canadian Intellectual Property Office Examination Search Report, dated Apr. 15, 2015, regarding Application No. 2,839,913, 4 pages.
Final Office Action, dated Oct. 22, 2015, regarding U.S. Appl. No. 13/852,063, 30 pages.
Office Action, dated Jul. 24, 2015, regarding U.S. Appl. No. 13/785,616, 55 pages.
Office Action, dated Sep. 21, 2015, regarding U.S. Appl. No. 13/835,262, 41 pages.
Office Action, dated Aug. 14, 2015, regarding U.S. Appl. No. 13/890,347, 44 pages.
Final Office Action, dated Sep. 4, 2015, regarding U.S. Appl. No. 13/861,678, 27 pages.
Office Action, dated Sep. 29, 2015, regarding U.S. Appl. No. 13/860,126, 34 pages.
Final Office Action, dated Jul. 31, 2015, regarding U.S. Appl. No. 13/922,411, 23 pages.
Australian Government Patent Examination Report No. 2, dated Oct. 29, 2015, regarding Application No. 2014200304, 4 pages.
Canadian Intellectual Property Office Examination Search Report, dated Oct. 28, 2015, regarding Application No. 2,839,914, 5 pages.
Australian Government Patent Examination Report No. 1, dated May 13, 2015, regarding Application No. 2014200304, 4 pages.
Canadian Intellectual Property Office Examination Search Report, dated Feb. 17, 2015, regarding Application No. 2,839,914, 6 pages.
European Patent Office Communcation, dated Sep. 15, 2015, regarding Application No. 14157597.7, 7 pages.
Notices of Reasons for Rejection and English Translation, issued Sep. 8, 2015, regarding Japanese Patent Application No. 2014-060864, 5 pages.
Kokogawa et al., "Wide-Area Contents Distribution based on Cooperation among Digital Libraries," Information Processing Academic Society Research Report, Mar. 10, 2000, vol. 2000, No. 26, pp. 83-88.

(56) References Cited

OTHER PUBLICATIONS

Notice of Allowance, dated Jun. 22, 2015, regarding U.S. Appl. No. 13/834,893, 24 pages.
Final Office Action, dated Jun. 26, 2015, regarding U.S. Appl. No. 13/855,102, 18 pages.
Office Action, dated Jun. 29, 2015, regarding U.S. Appl. No. 13/922,411, 43 pages.
Australian Government Patent Examination Report No. 2, dated Jul. 8, 2015, regarding Application No. 2014200514, 3 pages.
Australian Government Patent Examination Report No. 3, dated Aug. 13, 2015, regarding Application No. 2014200514, 4 pages.
Australian Government Patent Examination Report No. 2, dated Jul. 30, 2015, regarding Application No. 2014200292, 5 pages.
International Preliminary Report on Patentability, dated Sep. 1, 2015, regarding Application No. PCT/US2014/010912, 6 pages.
Final Office Action, dated May 6, 2016, regarding U.S. Appl. No. 13/861,678, 33 pages.
Office Action, dated Jan. 15, 2015, regarding U.S. Appl. No. 13/861,678, 37 pages.
Slack el al., "Non-Conformance Mapping and Visualization," U.S. Appl. No. 15/056,536, filed Feb. 29, 2016, 43 pages.
Office Action, dated Jan. 15, 2016, regarding U.S. Appl. No. 13/798,964, 36 pages.
Final Office Action, dated Feb. 9, 2016, regarding U.S. Appl. No. 13/835,262, 32 pages.
Office Action, dated Mar. 28, 2016, regarding U.S. Appl. No. 13/835,262, 21 pages.
European Patent Office Communication, dated Jan. 26, 2016, regarding Application No. 14159760.9, 5 pages.
Notices of Reasons for Rejection and English Translation, dated Jan. 29, 2016, regarding Japanese Patent Application No. 2014-060864, 7 pages.
Extended European Search Report, dated Nov. 18, 2015, regarding Application No. EP14159752.6, 6 pages.
Final Office Action, dated Nov. 20, 2015, regarding U.S. Appl. No. 13/890,347, 38 pages.
Final Office Action, dated Dec. 2, 2015, regarding U.S. Appl. No. 13/785,616, 38 pages.
Roh et al., "An object-based 3D walk-through model for interior construction progress monitoring", May 3, 2010, Elsevier, Automation in construction 20, pp. 66-75.
Prazak et al., "Visualization of an Object Using a Visual Query System," U.S. Appl. No. 15/003,802, filed Jan. 22, 2016, 49 pages.
Notice of Allowance, dated Oct. 4, 2016, regarding U.S. Appl. No. 13/798,964, 51 pages.
Office Action, dated Oct. 3, 2016, regarding U.S. Appl. No. 13/890,347, 60 pages.
Final Office Action, dated Oct. 20, 2016, regarding U.S. Appl. No. 13/785,616, 43 pages.
Final Office Action, dated Oct. 13, 2016, regarding U.S. Appl. No. 14/467,706, 28 pages.
Office Action, dated Dec. 14, 2016, regarding U.S. Appl. No. 13/861,678, 29 pages.

European Patent Office Examination Report, dated Oct. 14, 2016 regarding Application No. 14160787.9, 6 pages.
Extended European Search Report, dated Feb. 7, 2017, regarding Application No. 14725826.3, 8 pages.
State Intellectual Property Office of PRC Notification of First Office Action, dated Nov. 30, 2016, regarding Application No. 201480025761.0, 11 pages.
Office Action, dated Mar. 23, 2017, regarding U.S. Appl. No. 13/785,616, 35 pages.
Notice of Allowance, dated May 1, 2017, regarding U.S. Appl. No. 13/890,347, 25 pages.
Final Office Action, dated Apr. 20, 2017, regarding U.S. Appl. No. 13/861,678, 23 pages.
Office Action, dated Mar. 31, 2017, regarding U.S. Appl. No. 13/922,411, 31 pages.
Office Action, dated Apr. 18, 2017, regarding U.S. Appl. No. 15/056,536, 76 pages.
European Patent Office Examination Report, dated Jun. 28, 2017, regarding Application No. 14702979.7, 7 pages.
Notice of Allowance, dated Sep. 7, 2017, regarding U.S. Appl. No. 13/785,616, 28 pages.
Final Office Action, dated Jul. 19, 2017, regarding U.S. Appl. No. 13/922,411, 23 pages.
Notice of Allowance, dated Sep. 13, 2017, regarding U.S. Appl. No. 13/890,347, 22 pages.
State Intellectual Property Office of China, Notification of First Office action, dated Nov. 3, 2017, regarding Application No. 2014102817178, 2 pages.
Final Office Action, dated Oct. 26, 2017, regarding U.S. Appl. No. 15/056,536, 30 pages.
Canadian Intellectual Property Office Examination Search Report, dated Aug. 28, 2016, regarding Application No. 2,839,914, 6 pages.
Japanese Preliminary Examination Report, dated Aug. 5, 2016, regarding Application No. 2014-060864, 9 pages.
Office Action, dated Jul. 27, 2016, regarding U.S. Appl. No. 13/785,616 , 59 pages.
Notice of Allowance, dated Jun. 24, 2016, regarding U.S. Appl. No. 13/835,262 , 19 pages.
Office Action, dated Jul. 8, 2016 regarding U.S. Appl. No. 14/467,706 , 94 pages.
Extended European Search Report, dated Jun. 17, 2016, regarding Application No. EP15176304.2, 9 pages.
Japanese Notice of Reasons for Rejection and English translation, dated Jan. 9, 2018, regarding Application No. 2015560178, 8 pages.
Office Action, dated Mar. 13, 2018, regarding U.S. Appl. No. 15/003,802, 111 pages.
Japanese Notice of Reasons for Rejection and English translation, dated Apr. 10, 2018, regarding Application No. 2014081733, 6 pages.
Japanese Notice of Reasons for Rejection, dated Apr. 16, 2018, regarding Application No. 2016541961, 8 pages.
European Office Action, dated May 31, 2018, regarding Application No. 14160787.9, 10 pages.

* cited by examiner

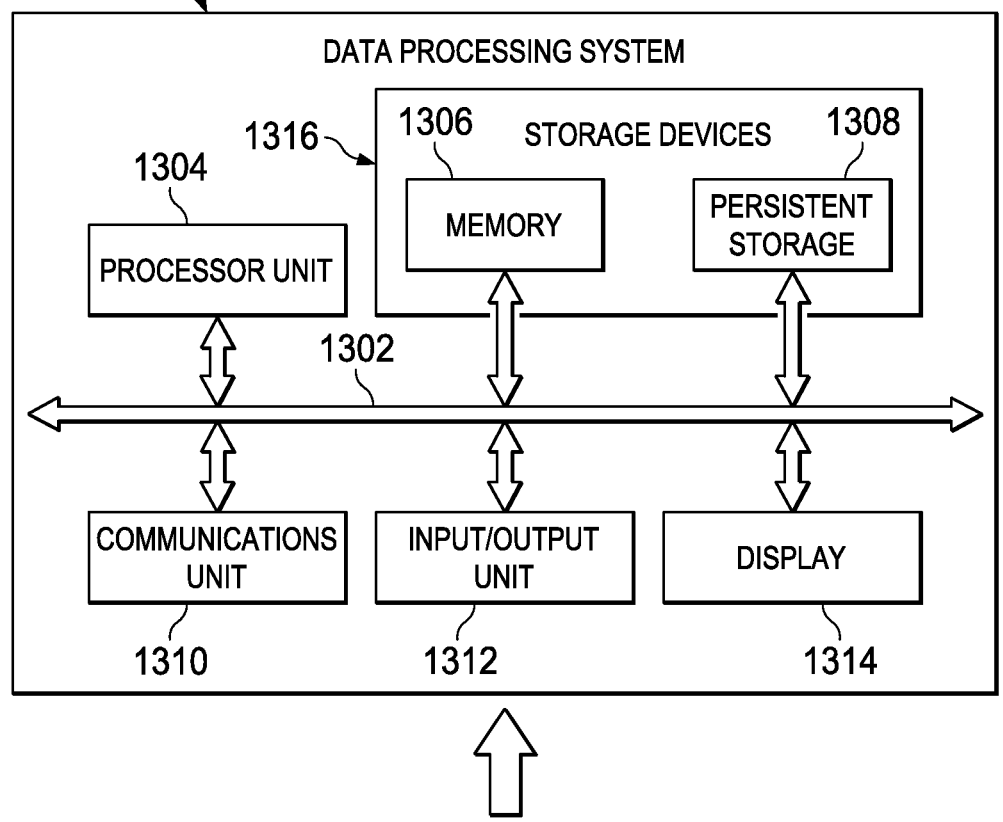
FIG. 13
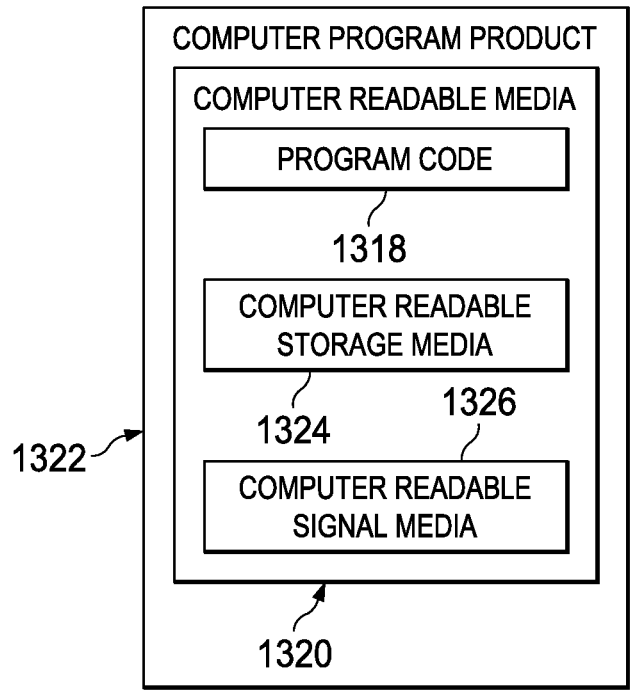

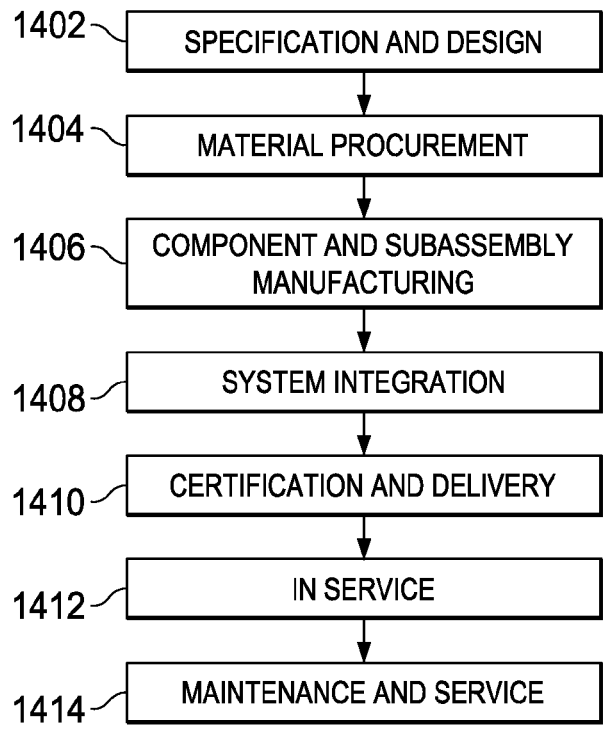
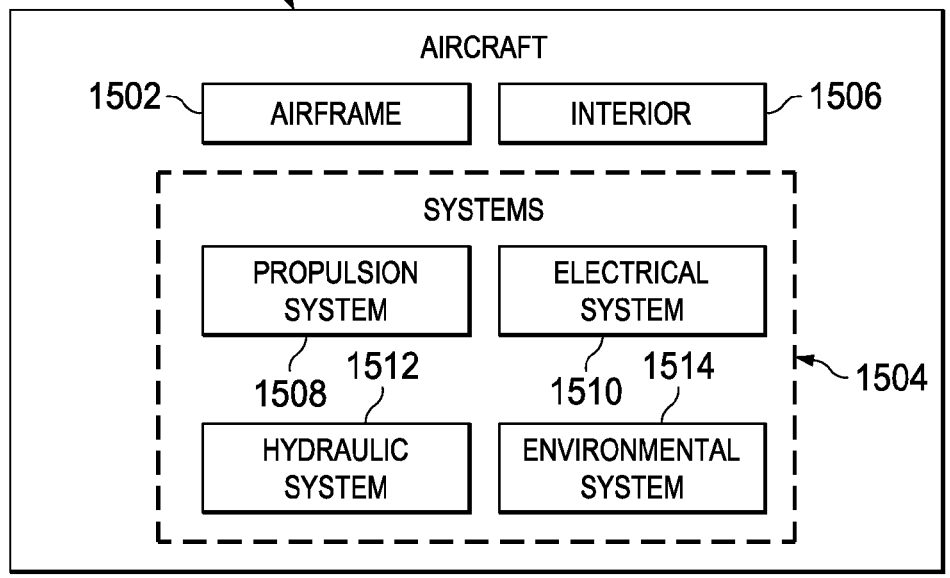

METHODS AND DEVICES FOR VISUALLY QUERYING AN AIRCRAFT BASED ON AN AREA OF AN IMAGE

CROSS-REFERENCE TO RELATED APPLICATIONS

This application is related to the following patent applications: entitled "Shop Order Status Visualization System," Ser. No. 13/785,616, filed Mar. 5, 2013, "Nonconformance Visualization System," Ser. No. 13/798,964, filed Mar. 13, 2013, "Condition of Assembly Visualization System," Ser. No. 13/834,893, filed Mar. 15, 2013, "Condition of Assembly Visualization System Based on Build Cycles," Ser. No. 13/835,262, filed Mar. 15, 2013, "Locator System for Three-Dimensional Visualization," Ser. No. 13/855,102, filed Apr. 2, 2013,"Shop Order Status Visualization System," Ser. No. 13/858,364, filed Apr. 8, 2013, "Aircraft Comparison System," Ser. No. 13/860,126, filed Apr. 10, 2013,"Nonconformance Visualization System," Ser. No. 13/861,678, filed Apr. 12, 2013, "Shop Order Status Visualization System," Ser. No. 13/890,347, filed May 9, 2013, and "Aircraft Comparison System with Synchronized Displays," Ser. No. 13/922,411, filed Jun. 20, 2013, each assigned to the same assignee, and each incorporated herein by reference.

BACKGROUND INFORMATION

1. Field

The present disclosure relates generally to manufacturing and, in particular, to manufacturing vehicles. Still more particularly, the present disclosure relates to a method and apparatus for assembling vehicles in a manufacturing environment.

2. Background

The assembly of an aircraft is an extremely complex process. Hundreds of thousands of parts may be assembled for an aircraft.

The assembly of an aircraft may involve manufacturing different parts of the aircraft in geographically diverse locations. These different parts may then be finally assembled in a single location. For example, different portions of a fuselage of the composite aircraft may be assembled in different locations and flown to a central location where the final assembly line is located. Additionally, other parts such as engines, auxiliary power units, seats, computer systems, line replaceable units, or other components in aircraft may be shipped to this final location for assembly to form the assembled aircraft.

The assembly of the different parts involves assigning tasks to different operators. The assignment of these tasks may take the form of shop order instances. Each shop order instance may include instructions and an identification of parts for a particular assembly in the aircraft.

Shop floor operators may have a need to identify locations of parts on the aircraft in order to follow assembly instructions described in shop order instances. These locations are ones relative to the particular aircraft being assembled. Currently, the operators assigned a task to assemble a part for the aircraft may look at paper copies of the parts of aircraft to determine where to perform tasks to install or assemble parts for the aircraft. These paper copies may provide some guidance to an operator, but often times they may be difficult to understand and may not include sufficient information.

In some cases, the operator may view a computer-aided design model of the aircraft using a computer-aided design software system. These types of systems, however, require training and experience to maneuver through the model of the aircraft.

For example, an operator of the computer-aided design software system often uses aircraft coordinates to identify locations in the aircraft. Aircraft coordinates have an origin relative to some location in the aircraft. Further, when traversing through the model, locations are identified using aircraft coordinates. These aircraft coordinates, however, are not helpful to an operator that is assigned a task in a shop order instance. The aircraft coordinates may need to be translated into action locations for the operator.

As a result, operators may take more time than needed, may need additional training, or both, to view locations in the aircraft where tasks in a shop order instance are to be performed. This additional time or training may increase the time or expense needed to assemble an aircraft.

Therefore, it would be desirable to have a method and apparatus that takes into account at least some of the issues discussed above, as well as other possible issues.

SUMMARY

In one illustrative embodiment, a method for visually querying an aircraft is present. A model is identified for the aircraft. Sections of the aircraft are displayed in a graphical user interface on a display device. The sections correspond to sections as manufactured for assembly of the aircraft. The sections are selectable.

In another illustrative embodiment, a method for visually querying an object is present. An object is identified. A model is identified for the object. Sections of an aircraft are displayed in a graphical user interface on a display device. The sections correspond to sections as manufactured for assembly of the aircraft. The sections are selectable.

In yet another illustrative embodiment, an apparatus comprises an object manager. The object manager is configured to identify a model for an aircraft. The object manager is further configured to display sections of the aircraft in a graphical user interface on a display device. The sections correspond to sections as manufactured for assembly of the aircraft. The sections are selectable.

In yet another illustrative embodiment, a manufacturing system comprises manufacturing equipment configured to manufacture an aircraft, a control system configured to control manufacturing of the aircraft, and an object manager in the control system. The object manager is configured to identify a model for an aircraft and to display sections of the aircraft in a graphical user interface on a display device. The sections correspond to sections as manufactured for assembly of the aircraft and the sections are selectable.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 13 is an illustration of a block diagram of a data processing system in accordance with an illustrative embodiment;

FIG. 14 is an illustration of an aircraft manufacturing and service method in accordance with an illustrative embodiment;

FIG. 15 is an illustration of an aircraft in which an illustrative embodiment may be implemented.

DETAILED DESCRIPTION

The illustrative embodiments recognize and take into account one or more different considerations. For example, the illustrative embodiments recognize and take into account that in performing tasks in shop order instances, operators may look at a visualization of the aircraft. For example, the illustrative items recognize and take into account that the operators may look at a model of an aircraft with the parts. The illustrative embodiments recognize and take into account that this process, however, is a tedious process. The operators on the shop floor performing assemblies are often not experienced or trained in using computer-aided design software used to view the models.

Viewing a model of an aircraft may take more time and effort than desired. For example, operators may require additional training. In some cases, operators may rely on other operators with training and experience. Thus, looking at parts in a model may take more time and effort than desired.

The illustrative embodiments provide a method and apparatus for visually querying an aircraft. A model is identified for the aircraft. Sections of the aircraft are displayed in a graphical user interface on a display device. In the illustrative examples, the sections may correspond to sections as manufactured for assembly of the aircraft. The sections are selectable.

Figure 1:
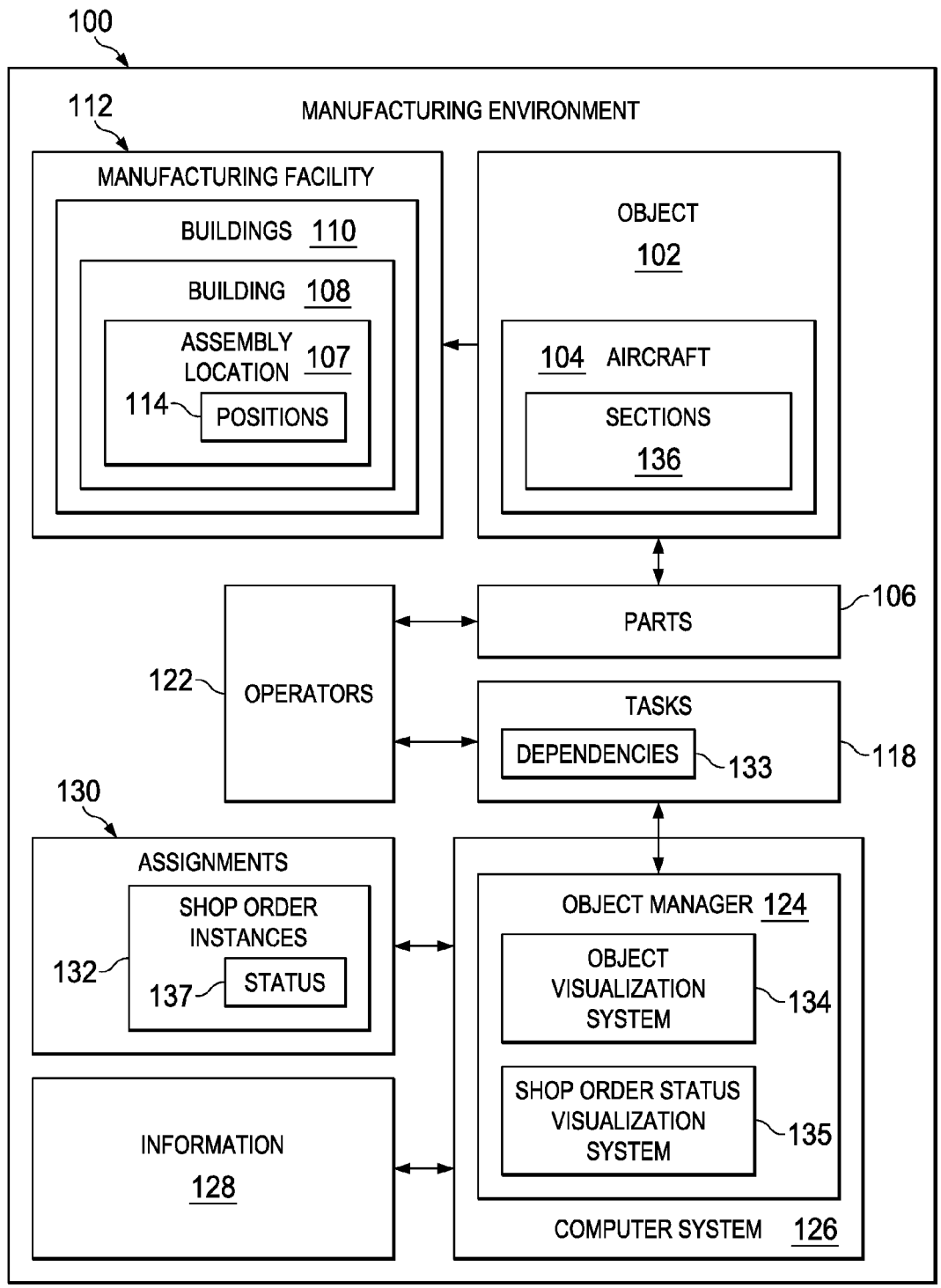
FIG. 1 is an illustration of a block diagram of a manufacturing environment in accordance with an illustrative embodiment.

With reference now to the figures, and in particular, with reference to FIG. 1, an illustration of a block diagram of a manufacturing environment is depicted in accordance with an illustrative embodiment. Manufacturing environment 100 is an example of an environment in which object 102 may be assembled.

In this illustrative example, object 102 takes the form of aircraft 104. Object 102 is completed by assembling parts 106. A part is a group of the components. As used herein, a "group of," when used with reference items, means one or more items. For example, a group of components is one or more components.

A part may be a single component or assembly of components in these depicted examples. For example, the part may be a seat, a row of seats, an in-flight entertainment system, a duct, a system of ducts, a global positioning system receiver, an engine, an engine housing, an inlet, or other suitable types of parts.

In this illustrative example, assembling parts 106 may take place in assembly location 107 in building 108 of buildings 110 at manufacturing facility 112. The assembly of parts 106 in building 108 may occur in positions 114 in assembly location 107 for object 102. Each position in positions 114 is a location in building 108 in which a group of tasks 118 is performed to assemble object 102.

In these illustrative examples, a task is a piece of work. A task may be comprised of one or more operations that are performed by a group of operators 122 assigned to work on the assembly of object 102.

In the illustrative examples, object manager 124 may be used to manage the assembly of object 102. When object 102 is aircraft 104, object manager 124 may be part of an aircraft management system. Object manager 124 may be implemented in software, hardware, firmware or a combination thereof.

When software is used, the operations performed by object manager 124 may be implemented in program code configured to run on a processor unit. When firmware is used, the operations performed by object manager 124 may be implemented in program code and data and stored in persistent memory to run on a processor unit. When hardware is employed, the hardware may include circuits that operate to perform the operations in object manager 124.

In the illustrative examples, the hardware may take the form of a circuit system, an integrated circuit, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, or other suitable hardware devices. Additionally, the processes may be implemented in organic components integrated with inorganic components and/or may be comprised entirely of organic components excluding a human being. For example, the processes may be implemented as circuits in organic semiconductors.

As depicted, object manager 124 may be implemented in computer system 126. Computer system 126 is one or more computers. When more than one computer is present, the computers in computer system 126 may communicate with each other using a communications medium such as a network. Computer system 126 may be located all in the same location or in different geographic locations. For example, computer system 126 may be distributed through buildings 110 or located in building 108. Portions of computer system 126 may even be located in another geographic location separate from manufacturing facility 112.

In managing the assembly of object 102, object manager 124 may manage tasks 118 and information 128 about object 102. In this illustrative example, the management of tasks 118 may include at least one of assigning tasks 118 to operators 122, monitoring the status of tasks 118, organizing tasks 118, providing information about tasks 118, or other suitable operations. Information 128 may include, for example, the models of objects, part inventories, or other suitable information relating to object 102.

As used herein, the phrase "at least one of," when used with a list of items, means different combinations of one or more of the listed items may be used and only one of each item in the list may be needed. For example, "at least one of item A, item B, and item C" may include, without limitation, item A or item A and item B. This example also may include item A, item B, and item C or item B and item C. The item may be a particular object, thing, or a category. In other words, at least one of means any combination of items and number of items may be used from the list but not all of the items in the list are required.

In these illustrative examples, object manager 124 may manage tasks 118 using assignments 130 in the form of shop order instances 132. For example, object manager 124 may assign tasks through the use of shop order instances 132 to operators 122 for performance and assembly of object 102. Additionally, the status of shop order instances 132 may be used to identify the state of assembly of object 102 by operators 122.

Additionally, tasks 118 may have dependencies 133. In other words, tasks 118 may be performed in a particular order. Dependencies 133 may dictate when tasks within tasks 118 should be performed relative to other tasks in tasks 118. Dependencies 133 may also be for parts 106 in addition to or in place of tasks 118. In this form, dependencies 133 may result in dependencies 133 for tasks 118.

As a result, dependencies 133 may affect the manner in which assignments 130 are made as shop order instances 132. In particular, dependencies 133 may be used to determine when shop order instances 132 should be performed.

In these illustrative examples, object manager 124 may provide different functions and capabilities for assembling object 102. For example, object manager 124 may include at least one of object visualization system 134, shop order status visualization system 135, or other types of systems. The systems may be implemented using hardware, software, or some combination thereof.

In one illustrative example, object visualization system 134 may provide a visualization of object 102 to operators 122. In particular, operators 122 may perform queries using object visualization system 134 to view a number of sections 136 in object 102. In particular, sections 136 may be sections that correspond to sections at manufacturing facility 112 for assembly of object 102, such as aircraft 104.

In these illustrative examples, the manufacturing may include at least one of fabricating components for parts, assembling components to form parts, assembling parts for object 102, or some other suitable manufacturing operation performed to assemble object 102.

For example, object manager 124 may provide visual information about all of object 102 or one or more specific sections of object 102. This type of visualization may be especially useful when object 102 takes the form of aircraft 104. Information 128 may be used when operators 122 perform tasks 118 with respect to parts 106 to assemble aircraft 104.

In another illustrative example, shop order status visualization system 135 may provide a visualization of status 137 of shop order instances 132. This information may be provided visually to operators 122. In particular, object manager 124 may function as shop order status visualization system 135 as well as provide other suitable functions in managing the assembly of object 102.

Figure 2:
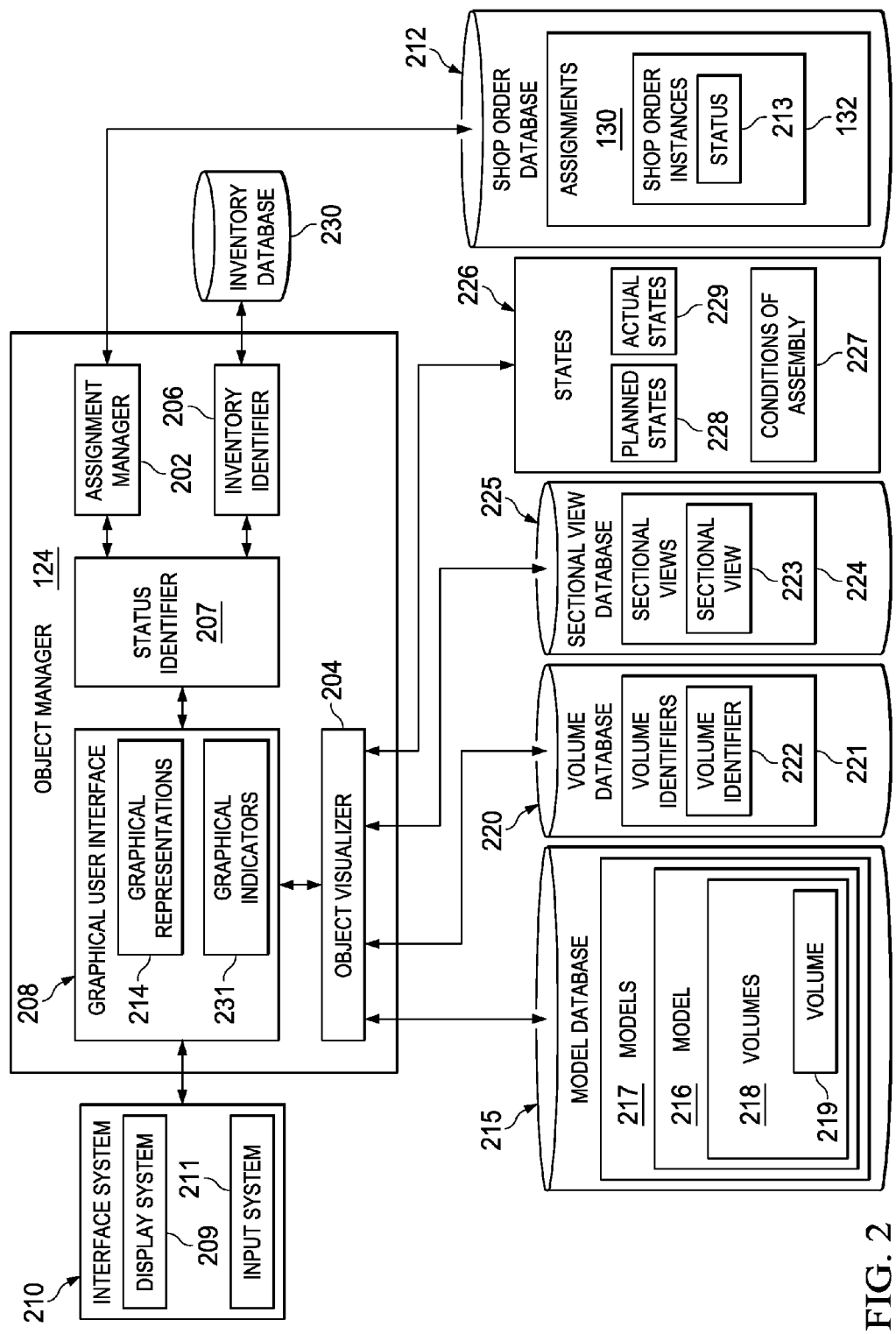
FIG. 2 is an illustration of a block diagram of an object manager in accordance with an illustrative embodiment.

Turning now to FIG. 2, an illustration of a block diagram of an object manager is depicted in accordance with an illustrative embodiment. Examples of components that may be implemented in object manager 124 in FIG. 1 are shown in this figure.

As depicted, object manager 124 includes a number of different components. For example, object manager 124 includes assignment manager 202, object visualizer 204, inventory identifier 206, status identifier 207, and graphical user interface 208. These different components along with object manager 124 may be implemented using hardware, software, or some combination thereof.

Graphical user interface 208 is configured to provide an interface for operators 122 in FIG. 1 to interact with object manager 124. In these illustrative examples, graphical user interface 208 may be displayed on display system 209 in interface system 210. Display system 209 is hardware and may include one or more display devices selected from at least one of a liquid crystal display (LCD), a light emitting display (LED), an organic light emitting display (OLED), or other suitable types of display devices.

Input may be received from operators 122 through input system 211 in interface system 210. Input system 211 is a hardware system. Input system 211 may include one or more devices. These devices may include at least one of a keyboard, a mouse, a joystick, a touchscreen panel, or other suitable types of devices.

In this illustrative example, assignment manager 202 is configured to manage assignments 130 in the form of shop order instances 132 in shop order database 212. For example, assignment manager 202 may be used to assign tasks 118 in FIG. 1 to operators 122 using shop order instances 132. Additionally, assignment manager 202 also may be configured to receive information about the performance of tasks 118 assigned through shop order instances 132. This information may be used by assignment manager 202 to generate and update status 213 for shop order instances 132.

Object visualizer 204 is configured to generate graphical representations 214 for parts 106 in FIG. 1. Graphical representations 214 may be displayed on graphical user interface 208 in display system 209. As depicted, object visualizer 204 is configured to access model database 215. Object visualizer 204 may identify model 216 from models 217 in model database 215 for object 102 in FIG. 1 and, in particular, for aircraft 104 in FIG. 1. Model 216 is used to generate graphical representations 214 in the illustrative example.

In these illustrative examples, graphical representations 214 may be generated for sections 136 of object 102 in FIG. 1, which may take the form of aircraft 104. In this illustrative example, model 216 may be identified for object 102 from models 217 in model database 215. Models 217 may take various forms. For example, without limitation, models 217 may include computer-aided design (CAD) files.

Each model in models 217 may be for a particular object. The objects may be of the same type but for different shop order instances. For example, if models 217 are for a particular type of aircraft, each model may be for a particular aircraft that is being assembled for a customer. The different models may be for the same aircraft model but may have variations for different options selected by a customer. In other illustrative examples, models 217 may include models for different types of aircraft 104.

The generation of graphical representations 214 may be based on all of model 216 or a group of volumes 218 in model 216. These items may have different shapes. For example, volume 219 in volumes 218 may be a cube, a cuboid, a cylinder, a sphere, or some other suitable shape.

In these illustrative examples, volume 219 is for at least a portion of a part in parts 106 of object 102. Volume 219 may be large enough to encompass the part. Volume 219 may also be larger than the part. In these illustrative examples, volume 219 may comprise an amount of space around the part for viewing the part in a graphical user interface. For example, the amount of space around the part may be for viewing the part in the graphical user interface from one or more angles. In this example, the one or more angles may be one or more angles from the point of view of an operator. In this example, the point of view of the operator may be of an operator performing a task associated with the part.

As depicted, volumes 218 may be identified in model 216 using volume database 220. Volume database 220 is a collection of information that may be used to identify which volumes in volumes 218 may be displayed as graphical representations 214. In particular, the collection of information may include volume identifiers 221. For example, volume identifier 222 in volume identifiers 221 may define volume 219 in volumes 218.

In these illustrative examples, an identification of volume 219 may be made using sectional view 223 in sectional views 224 in sectional view database 225. Sectional views 224 may include sectional views of the different objects. For example, sectional view 223 may correspond to model 216. An operator may select volumes 218 using sectional view 223 displayed on graphical user interface 208 in this particular example.

As depicted, sectional views 224 in sectional view database 225 may provide views of sections 136 for object 102. In the illustrative examples, sections 136 correspond to sections manufactured for assembly of object 102. In particular, sections 136 may correspond to sections manufactured for assembly of aircraft 104.

Further, sectional views 224 may include different levels of detail. For example, sectional views 224 may include a hierarchy of levels in which the lower levels have more detail about aircraft 104 then higher levels in the hierarchy. In some illustrative examples, a selection of a sectional view in sectional views 224 may result in another sectional view being displayed. In other illustrative examples, a selection made in a sectional view may result in graphical representations 214 being generated from model 216 and displayed on graphical user interface 208. In this manner, an operator may visually query aircraft 104 through the different sectional views in sectional views 224.

As a result, operator interaction generating user input with sectional view 223 displayed in graphical user interface 208 may be used to identify volumes 218 in model 216. The user input may be used to identify volume identifier 222 from volume identifiers 221. Volume identifier 222 may point to volume 219 in model 216.

In these illustrative examples, object visualizer 204 may generate queries using volume identifiers 221 to obtain information from model 216 in model database 215. In particular, information may be data about volume 219 in model 216 for aircraft 104.

As depicted, object visualizer 204 also may be configured to generate graphical representations 214 for states 226 of object 102. In these illustrative examples, states 226 may be used for object 102 in the form of aircraft 104. In other words, aircraft 104 may have different parts in parts 106 that are installed at different states within states 226. In the illustrative examples, states 226 may take the form of conditions of assembly 227 for object 102.

For example, states 226 may be based on positions 114 of aircraft 104 within assembly location 107 in building 108 in FIG. 1. In these illustrative examples, states 226 be selected from at least one of planned states 228 or actual states 229.

Aircraft 104 may have different planned states in planned states 228 in different positions in positions 114. In this illustrative example, a planned state in planned states 228 includes the parts that are expected to be installed at a particular position in positions 114. In other words, these parts may or may not have been installed at that position.

In these illustrative examples, the planned state may be based on the past position, current position, or the future position of aircraft 104 in positions 114. In other words, graphical representations 214 may be generated for any position that is present for planned states 228 for aircraft 104.

As depicted, an actual state in actual states 229 includes parts 106 that have actually been installed in aircraft 104. In other words, a particular state may have a selected number of parts that are installed at that state. The actual state in actual states 229 may be based on at least one of a past position, or the current position of aircraft 104. In other words, graphical representations 214 may be generated for parts 106 actually installed at a prior point in time. This prior point in time may be selected by an operator. In this manner, an operator may view tasks 118 performed to install parts 106 at some prior point in time.

Additionally, the actual state may be the current state of aircraft 104. In other words, graphical representations 214 may be generated for parts 106 that have been installed at the current point in time. In this manner, graphical representations 214 may be used to visualize parts 106 that are currently present in aircraft 104.

In these illustrative examples, the identification of parts that have already been installed or parts installed in prior points in time may be identified using shop order instances 132. In particular, shop order instances 132 may indicate whether or what parts in parts 106 have been installed.

Model database 215 is a database of models for objects. In these illustrative examples, these models may be, for example, computer-aided design models (CAD). Of course, any type of model that may provide information about the three-dimensional geometries of objects may be used. Additionally, these models may also include other information about materials, instruction assemblies, or other suitable types of information.

As depicted, inventory identifier 206 is configured to access inventory database 230. Inventory database 230 contains information about parts. Inventory database 230 may include information about whether parts are in stock, when parts will be delivered, the number of parts available, or other suitable types of information.

As depicted, status identifier 207 is configured to provide a visualization of the status for one or more of shop order instances 132. In this illustrative example, status identifier 207 is configured to provide an operator a graphical front end through graphical user interface 208 to identify the status of a shop order instance in a specific location of object 102, such as aircraft 104. This information may be identified without the operator knowing the coordinates of the particular location.

In these illustrative examples, object visualizer 204 is configured to identify a model of object 102, such as aircraft 104. For example, object visualizer 204 may identify the model in model database 215 for object 102.

Status identifier 207 is also configured to identify shop order instances 132 for object 102. The identification may be made through interaction with assignment manager 202.

In this illustrative example, status identifier 207 is also configured to identify status 213 of shop order instances 132. This identification also may be made through assignment manager 202.

Object visualizer 204 is configured to display graphical representations 214 of parts 106 in FIG. 1 for a group of shop order instances 132 in graphical user interface 208 on a display device in display system 209. The generation of graphical representations 214 may be based on the identification of a group of shop order instances 132. In other words, object visualizer 204 is configured to receive an identification of parts in the group of shop order instances 132. The identification of these parts may be used to generate graphical representations 214.

Further, status identifier 207 is also configured to display a set of graphical indicators 231 in association with graphical representations 214 of parts 106 displayed on graphical user interface 208 by object visualizer 204. As used herein, a "set of," when used with reference items, means one or more items. For example, a set of graphical indicators 231 is one or more of graphical indicators 231.

In these illustrative examples, a graphical indicator in graphical indicators 231 is considered to be displayed in association with a graphical representation in graphical representations 214 when the attention of an operator viewing graphical indicators 231 is drawn to the parts. Thus, the graphic indicator may be displayed as part of the graphical representation, on the graphical representation, in some proximity of the graphical representation, or in some other suitable manner that draws attention to the graphical representation.

The set of graphical indicators 231 displayed in association with graphical representations 214 of parts 106 may take different forms. For example, the set of graphical indicators 231 may be selected from at least one of a color, cross hatching, an icon, highlighting, animation, or other suitable types of graphical indicators.

Further, the group of shop order instances 132 may be identified in a number of different ways. For example, the group of shop order instances 132 may be identified by a user input to graphical user interface 208 from an operator. For example, the user input received may be a selection of the group of shop order instances 132.

In another illustrative example, the identification of the group of shop order instances 132 may be identified from a user input selecting a group of parts 106 in object 102 in FIG. 1. The selection of the group of parts 106 may be one of a selection of the group of parts 106 from a list of parts 106 and a selection of the group of parts 106 from a display of graphical representations 214 of parts 106 in graphical user interface 208.

Additionally, status identifier 207 may display information about a shop order instance for a part selected from graphical representations 214 of parts 106 displayed in graphical user interface 208.

With this information in graphical user interface 208, real-world operations may be performed. For example, the assembly of object 102 in FIG. 1 may be managed based on graphical representations 214 of parts 106 for shop order instances 132 and the set of graphical indicators 231 displayed on graphical user interface 208. For example, identifications of operations that should be performed may be made using this visualization. These operations may include when particular parts should be assembled, when inspections of parts assembled in object 102 should be made, or other suitable types of operations.

In FIG. 2, different components are illustrated as being located in object manager 124. These different components may be used as part of different systems. The systems may include at least one of object visualization system 134 in FIG. 1, shop order status visualization system 135 in FIG. 1, and other suitable systems. A component in object manager 124 may be used in more than one system. For example, object visualizer 204 may be in both object visualization system 134 and shop order status visualization system 135. In other words, the different components illustrated in object manager 124 may be used at the same time by different systems.

Figure 3:
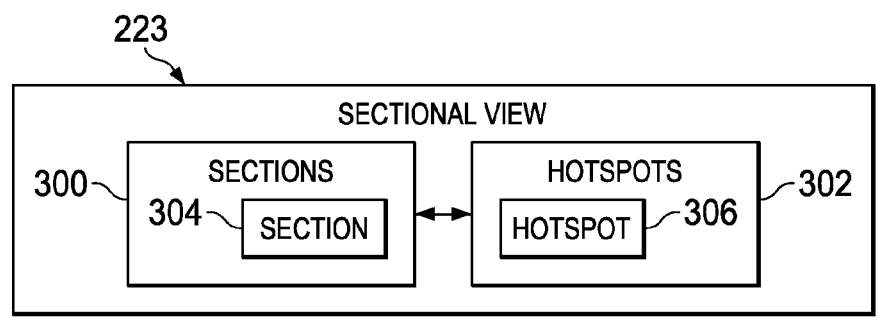
FIG. 3 is an illustration of a block diagram of a sectional view in accordance with an illustrative embodiment.

Turning now to FIG. 3, an illustration of a block diagram of a sectional view is depicted in accordance with an illustrative embodiment. An example of one implementation for sectional view 223 in FIG. 2 is shown.

As depicted, sectional view 223 includes a number of different pieces of information. For example, sectional view 223 includes sections 300 and hotspots 302.

Sections 300 are graphical representations corresponding to sections 136 for object 102 and, in particular, aircraft 104 in FIG. 1. In these illustrative examples, sections 300 may be located in a single image, multiple images, or some other suitable form. Further, sections 300 are graphical representations corresponding to sections 136 manufactured for assembly of aircraft 104.

In these illustrative examples, sections 300 may be selectable. A selection of section 304 in sections 300 having hotspot 306 results in a volume corresponding to section 304 in model 216 being displayed in this illustrative example. Hotspot 306 may be a pointer to volume identifier 222 associated with volume 219. For example, hotspot 306 may include a universal resource locator, or some other suitable addressing convention to identify volume identifier 222 from volume identifiers 221 in volume database 220.

Figure 4:
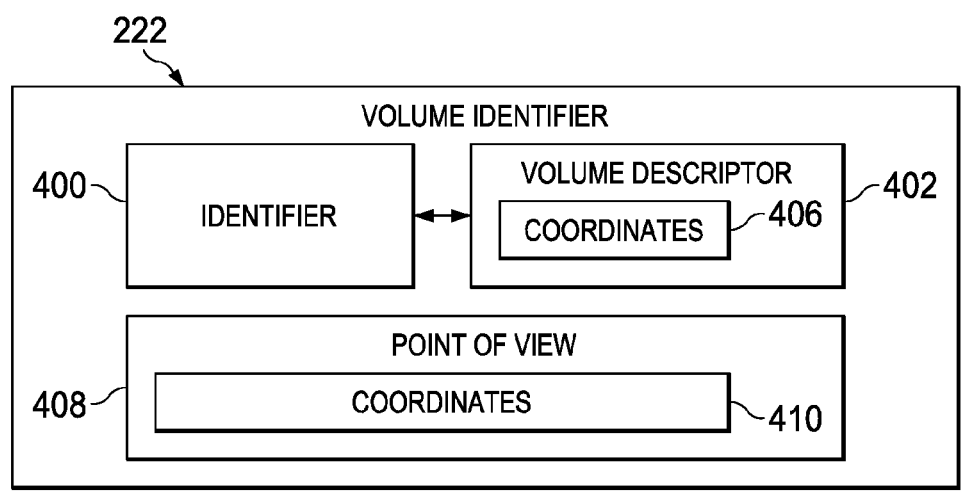
FIG. 4 is an illustration of a block diagram of a volume identifier in accordance with an illustrative embodiment.

Turning now to FIG. 4, an illustration of a block diagram of a volume identifier is depicted in accordance with an illustrative embodiment. In this illustrative example, one implementation for volume identifier 222 in FIG. 2 is shown.

Volume identifier 222 includes a number of components. As depicted, volume identifier 222 includes identifier 400 and volume descriptor 402.

Identifier 400 distinguishes volume identifier 222 from others of volume identifiers 221 that may be present in volume database 220. Identifier 400 may take various forms. For example, identifier 400 may be a word, a phrase, a number, an alphanumeric string, or some other suitable form.

Volume descriptor 402 describes the volume in model 216. For example, volume descriptor 402 may take the form of coordinates 406. Coordinates 406 are in the coordinate system used by model 216 in this example. For example, coordinates 406 may be three coordinates that may be used to define a polygon, a cube, or a cuboid. Of course, other information may be present in volume descriptor 402 other than coordinates 406. For example, volume descriptor 402 may include a single coordinate and a radius used to define volume 219 in a form of a sphere. In still other illustrative examples, a single coordinate may be present with preselected offsets that define volume 219 as a cube or some other shape.

In some illustrative examples, the volume identifier may also include point of view 408. Point of view 408 may define the view of the volume displayed to an operator when graphical representations 214 are displayed on graphical user interface. For example, point of view 408 may include coordinates 410 of the point of view using the coordinate system for the volume.

Figure 5:
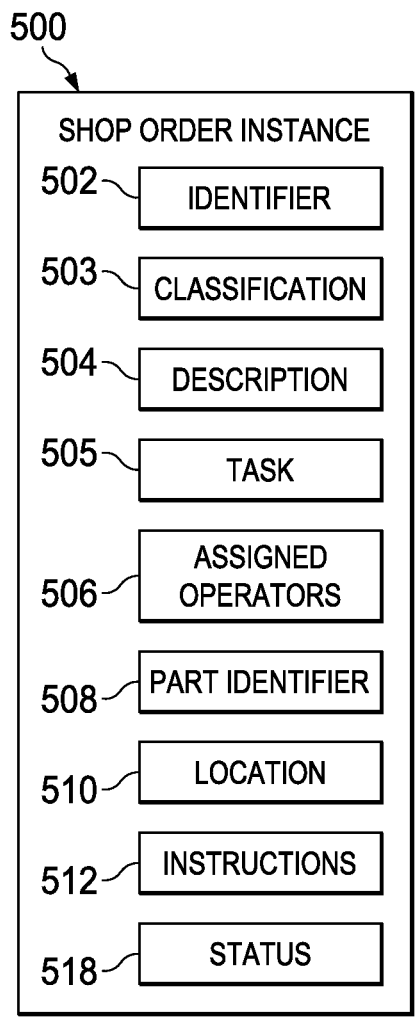
FIG. 5 is an illustration of a block diagram of a shop order instance in accordance with an illustrative embodiment.

With reference now to FIG. 5, an illustration of a block diagram of a shop order instance is depicted in accordance with an illustrative embodiment. As depicted, shop order instance 500 is an example of a shop order instance from shop order instances 132 in FIG. 1.

As depicted, shop order instance 500 may include a number of different parts. Shop order instance 500 includes identifier 502, classification 503, description 504, task 505, assigned operators 506, part identifier 508, location 510, instructions 512, and status 518.

As depicted, identifier 502 may be used to uniquely identify a task in tasks 118 in FIG. 1. Identifier 502 may be an alphanumeric identifier, a number, or some other suitable type of identifier.

In this illustrative example, classification 503 is used to classify the shop order instance. This classification may be based on the type of task to be performed. For example, the classifications may include seat installation, wiring, line replaceable unit installation, or other suitable types of classifications. The classification may be descriptive or may take the form of an identifier or other type of code.

Description 504 provides a description of task 505. This description may be a short description to provide the operator information about task 505. The description may be several words or a single sentence in some illustrative examples.

Task 505 identifies the work to be performed. For example, task 505 may be to install a part, assemble parts, perform an inspection, or some other suitable piece of work.

Assigned operators 506 identifies a group of operators that may be assigned to perform task 505. In some cases, an operator may not yet be assigned to perform task 505 for shop order instance 500.

In this illustrative example, part identifier 508 identifies a part assembled in object 102 using shop order instance 500. In this illustrative example, part identifier 508 is a part number for the part. For example, part identifier 508 may be a serial number, a combination of a serial number and vendor identifier, or some other suitable type of identification that uniquely identifies a particular part from other parts even if those parts are the same type.

In the illustrative examples, part identifier 508 may be used to generate the graphical representation of the parts identified. For example, part identifier 508 may be used to locate the information in a model needed to generate the graphical representation of the part for display.

Location 510 identifies the location where task 505 is to be performed. This location may be in coordinates for object 102 or some other coordinate system.

Instructions 512 are a group of instructions for performing task 505. In particular, the group of instructions may be for assembling a group of parts. These instructions may be step-by-step instructions, guidance, or other suitable types of instructions. These instructions may provide guidance for assembling parts, inspecting parts, or other suitable operations that may be performed for task 505. Instructions 512 also may include plans for the location in which task 505 is to be performed.

As depicted, status 518 provides information about the performance of task 505 for shop order instance 500. In this illustrative example, the status may indicate that work is to be performed, has been completed, is in progress, is unassigned, has been planned, is on hold, has been canceled, or some other suitable status for shop order instance 500. The status may be indicated using text, codes, symbols, or other suitable mechanisms. Additionally, if status 518 indicates that the work to be performed has been completed, status 518 also may include a date and time of when work for performing task 505 occurred.

The illustration of the different components that may be used in manufacturing environment 100 in FIGS. 1-5 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment. For example, although the illustrative examples are described with respect to an aircraft, an illustrative embodiment may be applied to other objects other than aircraft, such as, for example, without limitation, a vehicle, a submarine, a personnel carrier, a tank, a train, an automobile, a bus, a spacecraft, a surface ship, a spacecraft, a satellite, a rocket, an engine, a computer, harvesters, construction cranes, bulldozers, mining equipment, or other suitable types of objects.

With reference now to FIGS. 6-9, illustrations of the display of graphical user interfaces for identifying the status of shop order instances are depicted in accordance with an illustrative embodiment. These figures illustrate one manner in which graphical user interface 208 in FIG. 2 may be implemented. The different graphical user interfaces may be displayed on a display system, such as display system 209 in FIG. 2, and an operator may interact with the graphical user interfaces using an input system, such as input system 211 in FIG. 2.

Figure 6:
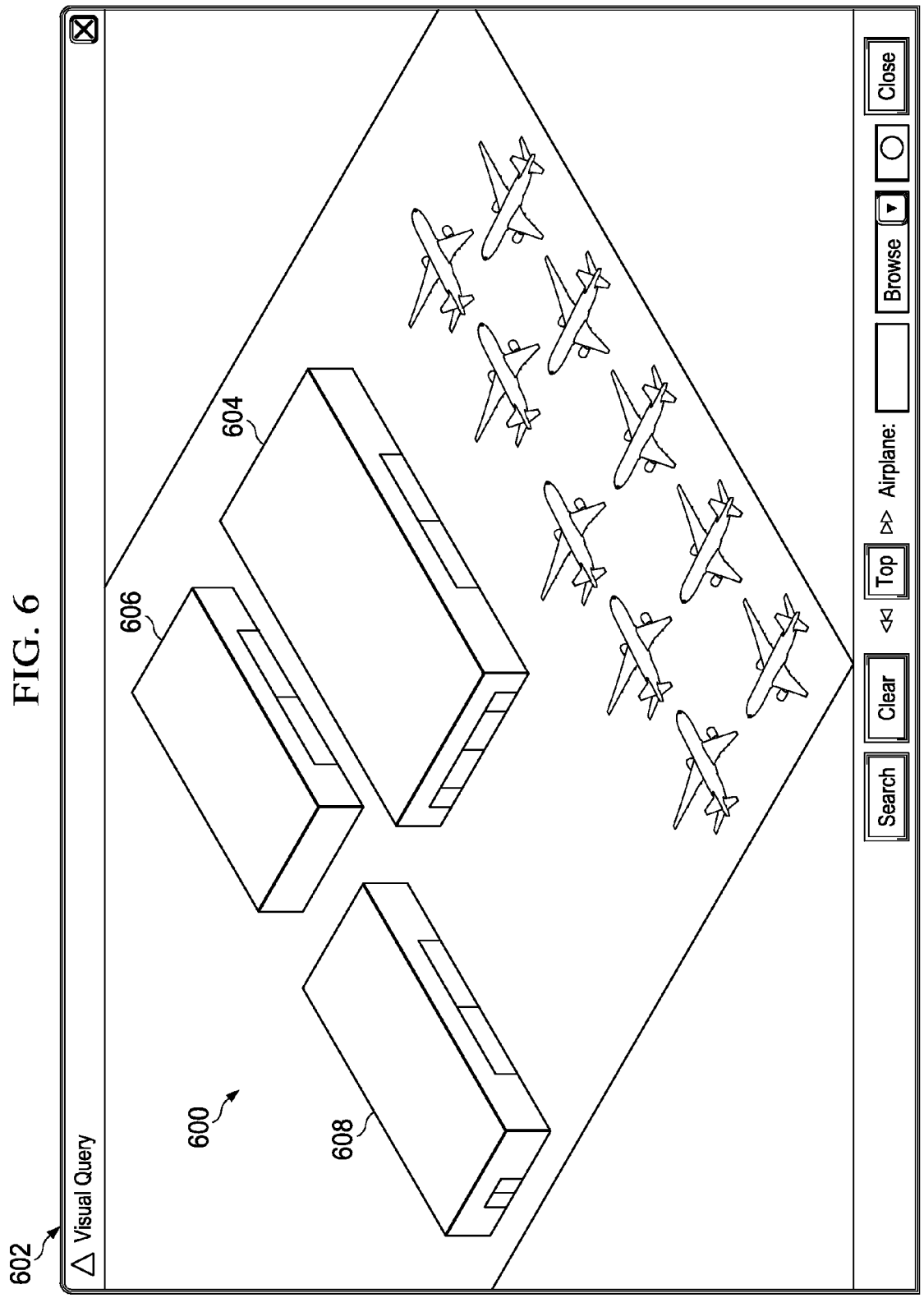
FIG. 6 is an illustration of a graphical user interface for viewing statuses of shop order instances in accordance with an illustrative embodiment.

With reference to FIG. 6, an illustration of a graphical user interface for viewing statuses of shop order instances is depicted in accordance with an illustrative embodiment. In this illustrative example, graphical user interface 600 displays buildings 602 including building 604, building 606, and building 608.

In this particular example, each building in buildings 602 in graphical user interface 600 represents a location where manufacturing of aircraft occurs. Each building may correspond to a database of aircraft that are manufactured within the building.

Figure 7:
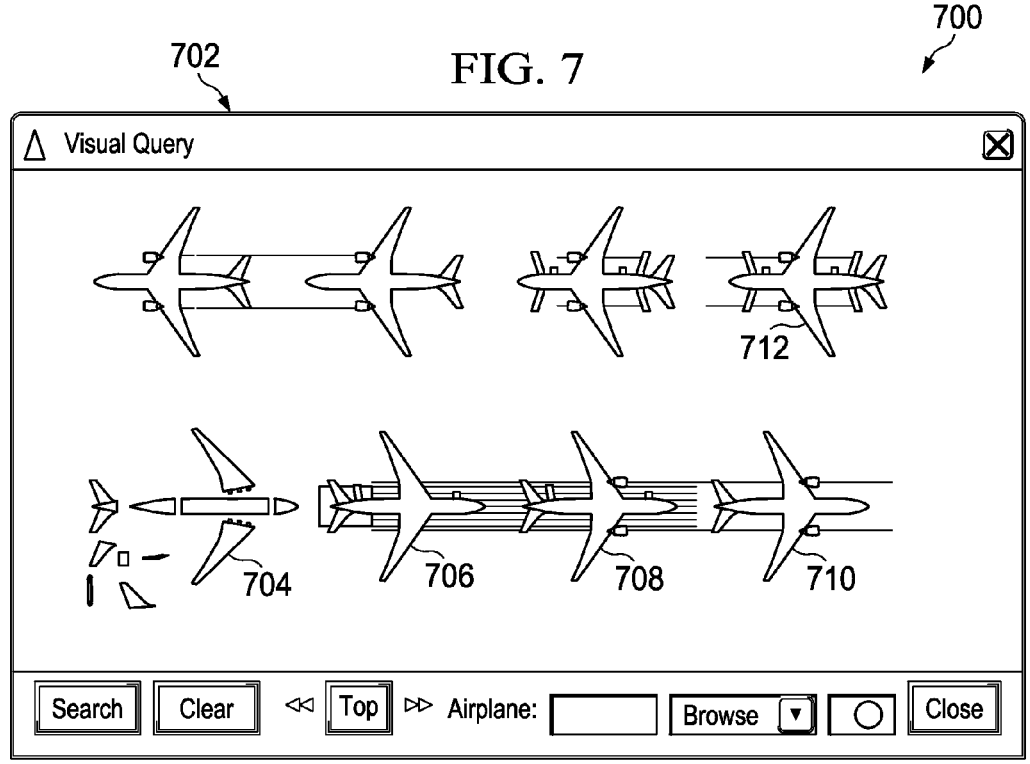
FIG. 7 is an illustration of aircraft positions in a building in accordance with an illustrative embodiment.

Turning now to FIG. 7, an illustration of aircraft positions in a building is depicted in accordance with an illustrative embodiment. In this illustrative example, aircraft positions 700 are displayed in graphical user interface 702. These positions correspond to tasks that may be performed at different stages of the assembly of an aircraft.

In this particular example, aircraft positions 700 include position 704, position 706, position 708, position 710, and position 712. In these illustrative examples, certain tasks are performed in different positions in aircraft positions 700. In other words, the aircraft assembly progresses from position to position with different parts being added to the aircraft at the different positions in aircraft positions 700.

A selection of one of these positions results in identifying graphical representations for parts that would be installed at a particular position as well as any parts that may have been installed from a prior position. As a result, parts that are not to be installed into a subsequent position are not present. For example, an aircraft in position 712 is a fully configured aircraft. An aircraft in position 710 may not have seats and carpet. An aircraft in position 708 may not include stove ends, lavatories, galleys, and other parts. These different positions in aircraft positions 700 may have different conditions of assembly for the aircraft in these illustrative examples.

In these illustrative examples, each of these positions may have models associated with the position. These models may contain the parts that are present in the aircraft for a particular position. As a result, a selection of a position results in a selection of models that may be used to display graphical representations of parts. As a result, models for positions with fewer parts may be queried more quickly to identify information to generate graphical representations of parts for the aircraft.

Additionally, in these illustrative examples, shop order instances in a shop order database may be identified for each of the positions. In other words, each position may have a shop order database containing shop order instances that may be generated for those particular positions. As a result, positions with fewer parts have fewer shop order instances to monitor or manage. In this manner, a faster query of a shop order database for a particular position may be made when that database is for a position with fewer parts. After the selection of the position, an operator may select a section of aircraft for review.

Figure 8:
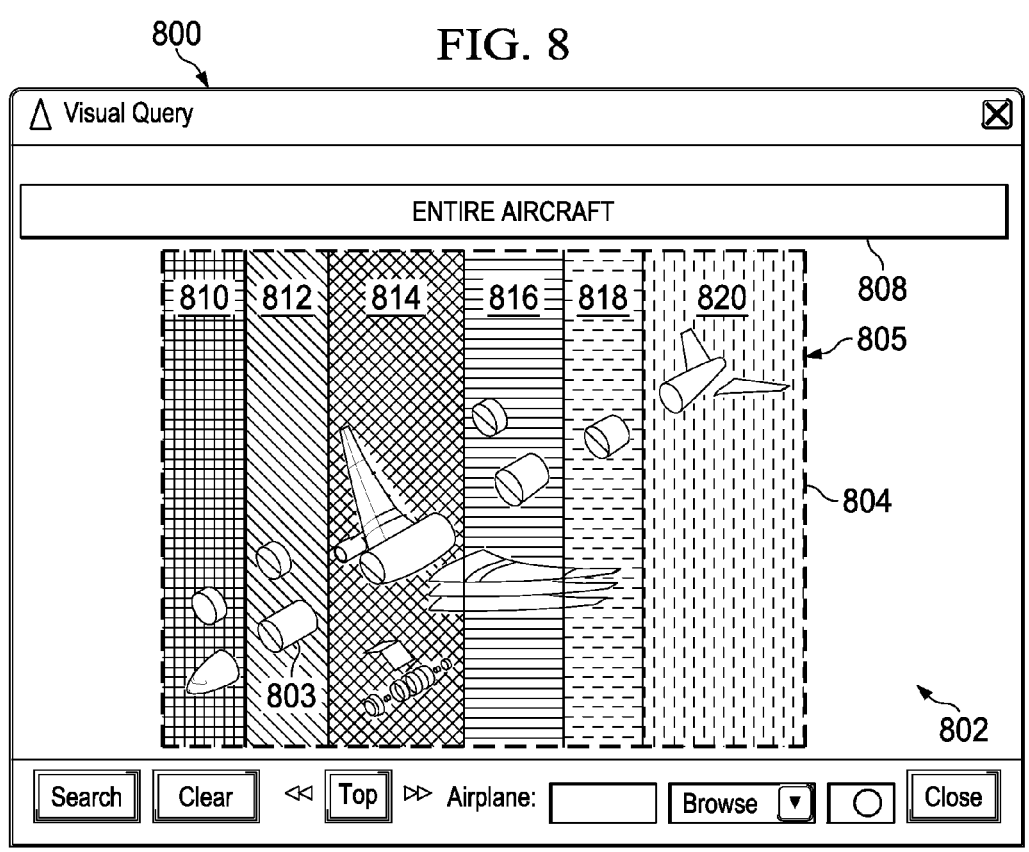
FIG. 8 is an illustration of a graphical user interface of aircraft sections in accordance with an illustrative embodiment.

Turning now to FIG. 8, an illustration of a graphical user interface of aircraft sections is depicted in accordance with an illustrative embodiment. In this illustrative example, graphical user interface 800 displays sections 802 for an aircraft in area 804 of graphical user interface 800.

As depicted, sectional view 805 is displayed in area 804 of graphical user interface 800. Sectional view 805 is an example of one implementation for sectional view 223 shown in block form in FIG. 2 and FIG. 3. In this particular example, sectional view 805 may be for an aircraft in position 712 in FIG. 7.

An operator may select a section from sections 802. As depicted, sections 802 are examples of sections 300 in FIG. 3 as displayed in graphical user interface 800. Sections 802 are selectable in this particular example. For example, section 803 in sections 802 is selectable by an operator in these illustrative examples. Section 803 is an upper barrel of an aircraft in this example.

With respect to selectability, sections 802 may include hotspots. These hotspots are not seen in this illustrative example. Hotspots are areas in graphical user interface 800 that may be selected to cause an action. In these illustrative examples, these hotspots correspond to sections 802. The hotspots may encompass sections 802 or may be around sections 802 or some combination thereof.

Additionally, an identification of the parts present in the section is also made in response to the user selection of a particular section. This identification may include any parts that are present for the particular position of the aircraft in that section. In other words, the same section of an aircraft in different positions may have different parts that are present based on tasks for installing parts. This identification may be made through the use of states 226 in FIG. 2.

In the illustrative example, an operator also may select to view the entire aircraft by selecting entire aircraft area 808 in graphical user interface 800. In other words, the volume for display may be the entire aircraft. Further, an operator may select groups of sections 802. As depicted, the selection may be made by selecting one of area 810, area 812, area 814, area 816, area 818, and area 820 in graphical user interface 800. In these illustrative examples, these areas have hotspots. In this manner, an operator may view different portions of an aircraft in a manner that suits the particular query that the operator desires.

Figure 9:
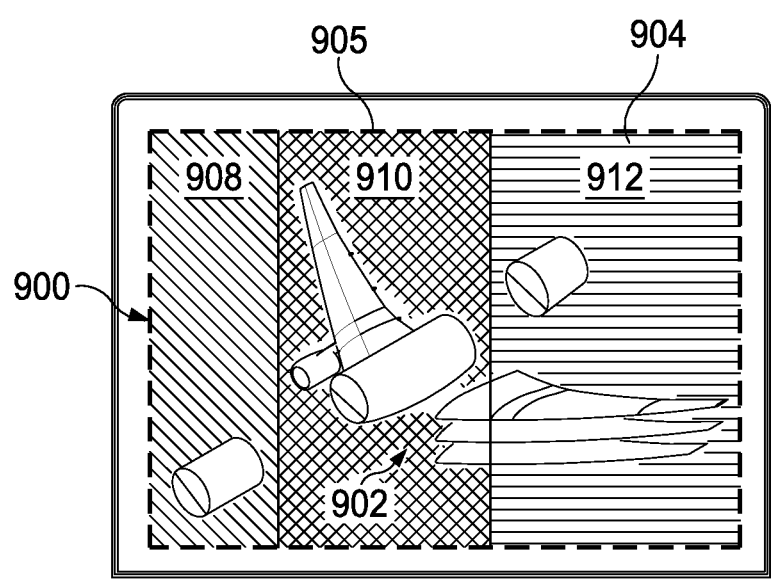
FIG. 9 is another illustration of a graphical user interface of aircraft sections in accordance with an illustrative embodiment.

Turning now to FIG. 9, another illustration of a graphical user interface of aircraft sections is depicted in accordance with an illustrative embodiment. In this illustrative example, graphical user interface 900 displays sections 902 for an aircraft in area 904 of graphical user interface 900.

As depicted, sectional view 905 is displayed in area 904 of graphical user interface 900. Sectional view 905 is an example of one implementation for sectional view 223 shown in block form in FIG. 2 and FIG. 3. In this particular example, sectional view 905 may be for an aircraft in position 704 in FIG. 7.

In this illustrative example, only a portion of an aircraft is illustrated in the view of sections 902 in sectional view 905. As depicted, only sections 902 that are present in a particular position are shown in this particular example.

Further, sections 902 also may be selectable. The selectable ability of sections 902 may be enabled through the use of hotspots associated with sections 902. As a result, the selection of a particular section in sections 902 may result in the display of the volume from a model of aircraft containing the selected section.

As depicted, area 908, area 910, and 912 also are selectable. These area group sections 902. These areas may also have hotspots associated with them. The selection of one of these areas results in a volume containing the different sections within an area being displayed.

Illustration of graphical user interface 600 with buildings 602 in FIG. 6, graphical user interface 702 with aircraft positions 700 in FIG. 7, and graphical user interface 800 with sections 802 in FIG. 8, and graphical user interface 900 with sections 902 in FIG. 9 are examples of multilevel querying that may be performed in accordance with an illustrative embodiment. As depicted, the selection of a building from buildings 602 may select a particular model for an aircraft. The particular model may be displayed with positions using graphical user interface 702. The selection of a position may result in another view being displayed with sections 802 in graphical user interface 800 or sections 902 in graphical user interface 900. In this manner, an operator may more easily traverse models of different aircraft, depending on the position selected.

Figure 10:
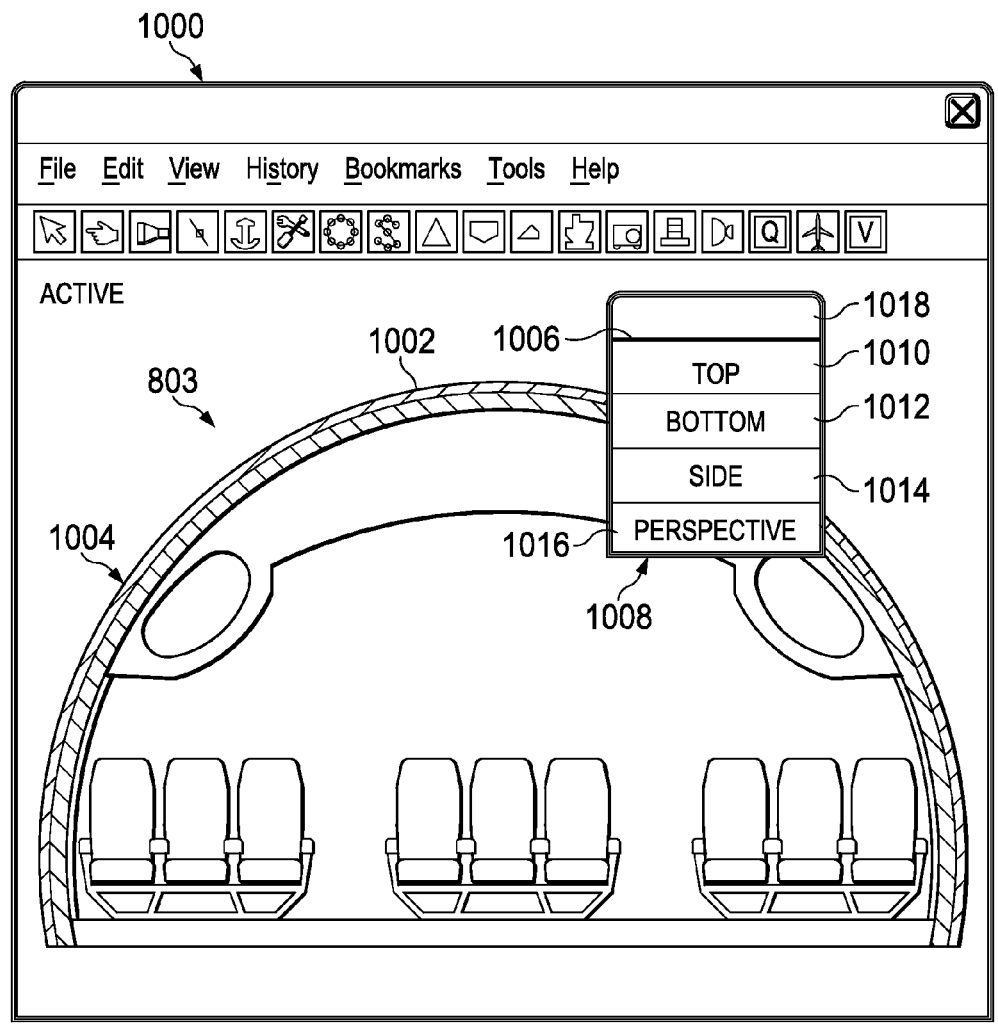
FIG. 10 is an illustration of a volume displayed in response to selection of a section in accordance with an illustrative embodiment.

Turning now to FIG. 10, an illustration of a volume displayed in response to selection of a section is depicted in accordance with an illustrative embodiment. In this depicted example, graphical user interface 1000 displays graphical representations 1002 of parts 1004 in section 803 in FIG. 8.

As depicted, this view of section 803 may be initially based on a default point of view. This point of view may be set using point of view 408 in FIG. 4. From this view of section 803, an operator may traverse section 803 in a number of different ways.

For example, an operator may select a graphical representation in graphical representations 1002 for a part in parts 1004 in section 803. The selection of the graphical representation for a part may provide a closer view of that part.

In another illustrative example, graphical representations 1002 of parts 1004 in section 803 may be traversed using commands 1006 displayed in menu 1008. In this illustrative example, commands 1006 include top 1010, bottom 1012, side 1014, and perspective 1016. Of course, these commands for different views are only examples and not meant to encompass all the different types commands may be used to view graphical representations 1002 of particular parts in parts 1004. For example, commands such as zoom, pan, and other suitable commands also may be present in addition to or in place of the ones depicted in this illustrative example.

Additionally, in some cases a part identifier may be entered into part field 1018. By entering a part identifier, different views of a particular part in parts 1004 may be seen by the operator. Additionally, the operator may also select a command for commands 1006 to provide a particular view of the part.

Of course, other processes may be used to traverse and view graphical representations 1002 of parts 1004 within section 803. These other processes may include those typically used with computer-aided design software and other types of software in which graphical representations 1002 of parts 1004 may be viewed and traversed.

The illustrations of the different graphical user interfaces in FIGS. 6-10 are provided only as examples of some implementations for graphical user interface 208 in FIG. 2. These examples are not meant to limit the manner in which an illustrative embodiment may be implemented. For example, although the different examples are displayed with reference to aircraft, similar displays may be used for other types of vehicles or objects. For example, the graphical user interfaces may be configured for sections of objects such as an automobile, a ship, a satellite, an engine, or some other suitable type of object.

As another illustrative example, the display of the different graphical user interfaces may be performed using other graphical user interfaces in addition to or in place of the ones depicted. Further, the order of the graphical user interfaces may vary from the order described above.

Figure 11:
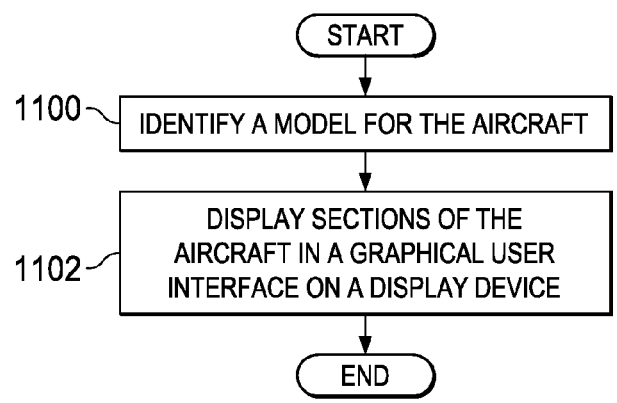
FIG. 11 is an illustration of a flowchart of a process to visually query an object in accordance with an illustrative embodiment.

With reference next to FIG. 11, an illustration of a flowchart of a process to visually query an object is depicted in accordance with an illustrative embodiment. In this illustrative example, the method may be used to visually query an object such as an aircraft. The process may be implemented using object manager 124 in FIG. 1. In particular, one or more of the different components for object manager 124 illustrated in FIG. 2 may be used to visually query an aircraft.

The process begins by identifying a model for the aircraft (operation 1100). In the illustrative examples, a model for the aircraft may be identified in a number of ways as described above. For example, a model may be identified by selecting the model from a list of models. In other illustrative examples, the model may be identified visually using a graphical user interface such as graphical user interface 600 in FIG. 6.

The process then displays sections of the aircraft in a graphical user interface on a display device (operation 1102), with the process terminating thereafter. The sections correspond to sections manufactured for assembly of aircraft. Further, the sections also are selectable in the illustrative examples. The ability to select these sections may be provided through various mechanisms. In this illustrative example, the selectability may be provided through hotspots associated with the sections that are displayed in the graphical user interface. Further, the sections are displayed in an exploded view in operation 1102.

Figure 12:
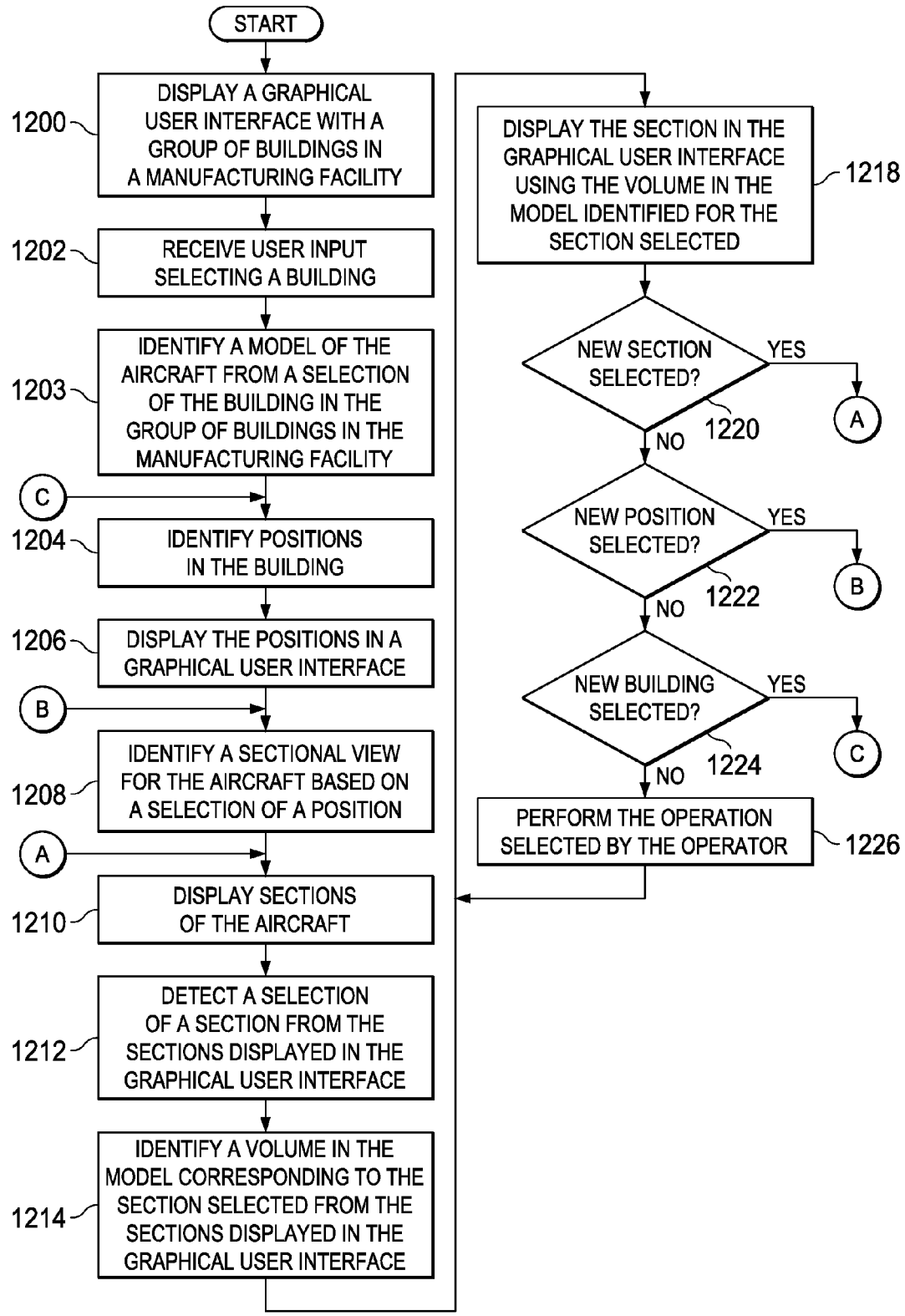
FIG. 12 is an illustration of a flowchart of a process for visually querying an aircraft in accordance with an illustrative embodiment.

Turning now to FIG. 12, an illustration of a flowchart of a process for visually querying an aircraft is depicted in accordance with an illustrative embodiment. This process is an example of one manner in which an operator may visually view different parts of an aircraft without needing to know coordinates for the different locations in which the parts are located. The different operations illustrated in FIG. 12 may be implemented using object visualizer 204 in FIG. 2.

The process begins by displaying a graphical user interface with a group of buildings in a manufacturing facility (operation 1200). The graphical user interface includes hotspots for the buildings that can be selected. A hotspot is a portion of the graphical user interface that may be selected to cause an action. In these illustrative examples, the buildings are hotspots that may be selected by an operator.

The process then receives user input selecting a building (operation 1202). In this illustrative example, each building may be used to assemble a particular aircraft. The particular aircraft may be a particular type of aircraft such as the model. In some cases, more than one building may be used to assemble the same type of aircraft but the particular aircraft may be a specific build for a customer with specific options. In other words, different aircraft of the same type may be assembled in different buildings that have different options although they are of the same type.

Next, a model of the aircraft is identified from a selection of the building in the group of buildings in the manufacturing facility (operation 1203). Positions in the building are identified (operation 1204). Each building may have different positions for the aircraft that are being assembled. Further, even if a building has the same positions, the status of an aircraft at a particular building at particular positions may be different from other buildings. Further, even with the same positions, different aircraft may be assembled in the positions in different buildings.

The positions are displayed in a graphical user interface (operation 1206). In these illustrative examples, the different positions are hotspots that may be selected through user input entered by an operator. The process then receives user input for selecting a position.

The process then identifies a sectional view for the aircraft based on a selection of a position (operation 1208). In this illustrative example, each position may have a different sectional view that may be displayed. The sections of aircraft in a position are the sections manufactured at the position selected in these illustrative examples. The sectional view includes sections for that particular position.

As depicted, the sectional view may be, for example, sectional view 223 in sectional views 224 in FIG. 2. Different sectional views are present for different positions in the illustrative example. Sectional view 805 in FIG. 8 and sectional view 905 in FIG. 9 are examples of sectional views that may be selected depending on the position selected for the aircraft in operation 1208.

In these illustrative examples, the sectional views were selected for parts that are present in the aircraft for the position. These are parts that may already be present from assembly of the aircraft in a prior position or may be parts that are to be assembled in the position selected.

The process then displays sections of the aircraft (operation 1210). In operation 1210, the sections are displayed in the sectional view of the aircraft. Further, the different sections are displayed in association with hotspots that may be selected by user input entered by an operator. The process then detects a selection of a section from the sections displayed in the graphical user interface (operation 1212). In operation 1212, the section has hotspots associated with the volume identifier. The selection of a section of an aircraft involves selecting the hotspot associated with the aircraft. The hotspot points to a volume identifier, such as volume identifier 222 in FIG. 2. In some cases, the hotspot may be a link pointing to the volume identifier. For example, the hotspot may be an index used to identify a volume identifier.

The process then identifies a volume in the model corresponding to the section selected from the sections displayed in the graphical user interface (operation 1214). In these illustrative examples, each section of an aircraft is associated with the volume for the aircraft. This volume is identified from volume identifiers associated with sections in the sectional view using the volume identifier pointed to by the hotspot selected for the section. The volume identifier may include information defining the volume. For example, volume identifier 222 may include volume descriptor 402 as depicted in FIG. 4. In particular, the identifier may include a group of coordinates defining the volume in the model.

The process then displays the section in the graphical user interface using the volume in the model identified for the section selected (operation 1218). Next, a determination is made as to whether a new section of the aircraft has been selected for the position of the aircraft (operation 1220). If any section has been selected, the process then returns to operation 1210 as described above.

If a new section has not been selected, a determination is made as to whether a new position has been selected for the aircraft (operation 1222). If a new position has been selected, the process then returns to operation 1208 as described above. If a new position has not been selected, the process determines whether a new building has been selected (operation 1224). If a new building has been selected, the process returns to operation 1204. Otherwise, the process performs the operation selected by the operator (operation 1226) with the process then returning to operation 1218. In operation 1226, the operator may rotate the parts displayed in the volume, magnify the display, remove parts, annotate parts, or perform other operations with respect to the parts displayed in the volume.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

In one illustrative example, sections may not be displayed in an exploded view in operation 1202. Instead, the sections may be displayed as a whole aircraft in which different sections may be selected through hotspots. The different sections may be indicated using lines or other graphical indicators in this type of implementation.

Turning now to FIG. 13, an illustration of a block diagram of a data processing system is depicted in accordance with an illustrative embodiment. Data processing system 1300 may be used to implement computer system 126 in FIG. 1. In this illustrative example, data processing system 1300 includes communications framework 1302, which provides communications between processor unit 1304, memory 1306, persistent storage 1308, communications unit 1310, input/output unit 1312, and display 1314. In this example, communications framework may take the form of a bus system.

Processor unit 1304 serves to execute instructions for software that may be loaded into memory 1306. Processor unit 1304 may be a number of processors, a multi-processor core, or some other type of processor, depending on the particular implementation.

Memory 1306 and persistent storage 1308 are examples of storage devices 1316. A storage device is any piece of hardware that is capable of storing information, such as, for example, without limitation, data, program code in functional form, and/or other suitable information either on a temporary basis and/or a permanent basis. Storage devices 1316 may also be referred to as computer readable storage devices in these illustrative examples. Memory 1306, in these examples, may be, for example, a random access memory or any other suitable volatile or non-volatile storage device. Persistent storage 1308 may take various forms, depending on the particular implementation.

For example, persistent storage 1308 may contain one or more components or devices. For example, persistent storage 1308 may be a hard drive, a flash memory, a rewritable optical disk, a rewritable magnetic tape, or some combination of the above. The media used by persistent storage 1308 also may be removable. For example, a removable hard drive may be used for persistent storage 1308.

Communications unit 1310, in these illustrative examples, provides for communications with other data processing systems or devices. In these illustrative examples, communications unit 1310 is a network interface card.

Input/output unit 1312 allows for input and output of data with other devices that may be connected to data processing system 1300. For example, input/output unit 1312 may provide a connection for user input through a keyboard, a mouse, and/or some other suitable input device. Further, input/output unit 1312 may send output to a printer. Display 1314 provides a mechanism to display information to a user.

Instructions for the operating system, applications, and/or programs may be located in storage devices 1316, which are in communication with processor unit 1304 through communications framework 1302. The processes of the different embodiments may be performed by processor unit 1304 using computer-implemented instructions, which may be located in a memory, such as memory 1306.

These instructions are referred to as program code, computer usable program code, or computer readable program code that may be read and executed by a processor in processor unit 1304. The program code in the different embodiments may be embodied on different physical or computer readable storage media, such as memory 1306 or persistent storage 1308.

Program code 1318 is located in a functional form on computer readable media 1320 that is selectively removable and may be loaded onto or transferred to data processing system 1300 for execution by processor unit 1304. Program code 1318 and computer readable media 1320 form computer program product 1322 in these illustrative examples.

In one example, computer readable media 1320 may be computer readable storage media 1324 or computer readable signal media 1326. In these illustrative examples, computer readable storage media 1324 is a physical or tangible storage device used to store program code 1318 rather than a medium that propagates or transmits program code 1318.

Alternatively, program code 1318 may be transferred to data processing system 1300 using computer readable signal media 1326. Computer readable signal media 1326 may be, for example, a propagated data signal containing program code 1318. For example, computer readable signal media 1326 may be an electromagnetic signal, an optical signal, and/or any other suitable type of signal. These signals may be transmitted over communications links, such as wireless communications inks, optical fiber cable, coaxial cable, a wire, and/or any other suitable type of communications link.

The different components illustrated for data processing system 1300 are not meant to provide architectural limitations to the manner in which different embodiments may be implemented. The different illustrative embodiments may be implemented in a data processing system including components in addition to and/or in place of those illustrated for data processing system 1300. Other components shown in FIG. 13 can be varied from the illustrative examples shown. The different embodiments may be implemented using any hardware device or system capable of running program code 1318.

Illustrative embodiments of the disclosure may be described in the context of aircraft manufacturing and service method 1400 as shown in FIG. 14 and aircraft 1500 as shown in FIG. 15. Turning first to FIG. 14, an illustration of an aircraft manufacturing and service method is depicted in accordance with an illustrative embodiment. During pre-production, aircraft manufacturing and service method 1400 may include specification and design 1402 of aircraft 1500 in FIG. 15 and material procurement 1404.

During production, component and subassembly manufacturing 1406 and system integration 1408 of aircraft 1500 in FIG. 15 takes place. Thereafter, aircraft 1500 in FIG. 15 may go through certification and delivery 1410 in order to be placed in service 1412. While in service 1412 by a customer, aircraft 1500 in FIG. 15 is scheduled for routine maintenance and service 1414, which may include modification, reconfiguration, refurbishment, and other maintenance or service.

Each of the processes of aircraft manufacturing and service method 1400 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 15, an illustration of an aircraft is depicted in which an illustrative embodiment may be implemented. In this example, aircraft 1500 is produced by aircraft manufacturing and service method 1400 in FIG. 14 and may include airframe 1502 with systems 1504 and interior 1506. Examples of systems 1504 include one or more of propulsion system 1508, electrical system 1510, hydraulic system 1512, and environmental system 1514. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 1400 in FIG. 14. For example, one or more illustrative embodiments may be implemented during system integration 1408. The different illustrative examples may be implemented to identify information to perform tasks to assemble parts on aircraft 1500.

In particular, the visual query of aircraft may be used to identify locations where tasks for shop order instances are to be performed or where tasks have been performed. Additionally, an illustrative embodiment also may be implemented during maintenance and service 1414. For example, information about the aircraft may be visually queried and viewed by an operator to perform tasks to assemble parts for maintenance, upgrades, refurbishment, and other operations during maintenance and service 1414 may be identified using an illustrative embodiment.

Figure 16:
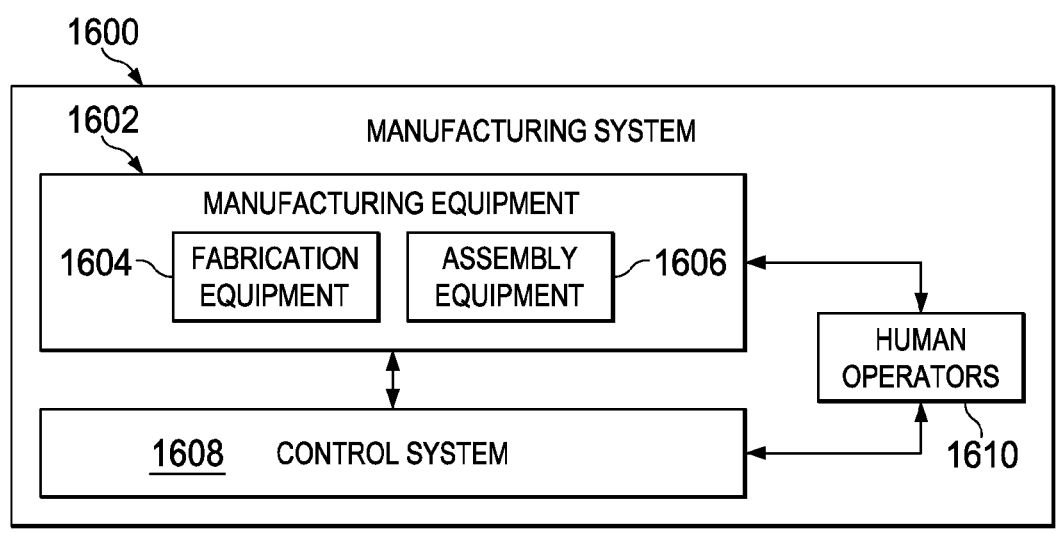
FIG. 16 is an illustration of a manufacturing system in accordance with an illustrative embodiment.

Turning now to FIG. 16, an illustration of a manufacturing system is depicted in accordance with an illustrative embodiment. Manufacturing system 1600 is a physical hardware system and is configured to manufacture products, such as aircraft 1500 in FIG. 15.

As depicted, manufacturing system 1600 includes manufacturing equipment 1602. Manufacturing equipment 1602 includes at least one of fabrication equipment 1604 or assembly equipment 1606.

Fabrication equipment 1604 is equipment that may be used to fabricate components for parts used to form aircraft 1500. For example, fabrication equipment 1604 may include machines and tools. These machines and tools may be at least one of a drill, a hydraulic press, a furnace, a mold, a composite tape laying machine, a vacuum system, a lathe, or other suitable types of equipment. Fabrication equipment 1604 may be used to fabricate at least one of metal parts, composite parts, semiconductors, circuits, fasteners, ribs, skin panels, spars, antennas, pharynx, or other suitable types of parts.

Assembly equipment 1606 is equipment used to assemble parts to form aircraft 1500. In particular, assembly equipment 1606 may be used to assemble components and parts to form aircraft 1500. Assembly equipment 1606 also may include machines and tools. These machines and tools may be at least one of a robotic arm, a crawler, a faster installation system, a rail-based drilling system, or a robot. Assembly equipment 1606 may be used to assemble parts such as seats, horizontal stabilizers, wings, engines, engine housings, landing gear systems, and other parts for aircraft 1500.

Manufacturing system 1600 also includes control system 1608. Control system 1608 is a hardware system and may also include software or other types of components. Control system 1608 is configured to control the operation of manufacturing equipment 1602. Control system 1608 may be implemented using hardware. The hardware may include computers, circuits, networks, and other types of equipment. The control may take the form of direct control of manufacturing equipment 1602. For example, robots, computer-controlled machines, and other equipment may be controlled by control system 1608. In other illustrative examples, control system 1608 may managing operations performed by human operators 1610 in manufacturing aircraft 1500.

In these illustrative examples, object manager 124 in FIG. 1 may be implemented in control system 1608 to manage the manufacturing of aircraft 1500 in FIG. 15.

In the different illustrative examples, human operators 1610 may operate or interact with at least one of manufacturing equipment 1602 or control system 1608. This interaction may be performed to manufacture aircraft 1500.

Of course, manufacturing system 1600 may be configured to manufacture other products. Although manufacturing system 1600 has been described with respect to manufacturing in the aerospace industry, manufacturing system 1600 may be configured to manufacture products for other industries. For example, manufacturing system 1600 may be configured to manufacture products for the automotive industry as well as any other suitable industries.

In this manner, operators may visualize information about an aircraft using a graphical user interface. This visualization may be performed on the shop floor by operators who may not have experience and training with computer-aided design software. This visual query allows an operator to visually look at an aircraft or other object.

The visualization may be performed without operators having to know coordinates for locations in the aircraft. In these illustrative examples, the graphical user interface displays graphical representations of the aircraft that allows the operators to view different portions of the aircraft without using coordinates to traverse the views of the aircraft.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for visually querying an aircraft, the method comprising:
   displaying, on a display device, a first graphical user interface including a visual map of a plurality of locations where one or more aircraft are assembled in a building;
   receiving a selection of a location from among said plurality of locations on the visual map;
   identifying an aircraft electronic model associated with a corresponding location on the visual map based on the selection being associated with selecting a location out of the plurality of locations in the building;
   displaying sections of the identified aircraft electronic model in a second graphical user interface different from the first graphical user interface, wherein the displayed sections correspond to aircraft sections that are available for assembly at the selected location on the visual map, and wherein the sections are selectable;
   detecting a selection of a section from the sections displayed in the second graphical user interface;
   identifying in the first graphical user interface, using a volume identifier, a volume in the identified aircraft electronic model corresponding to the section selected from the sections displayed, wherein the volume identifier identifies the volume in the identified aircraft electronic model by using an identifier and a volume descriptor to specify the volume, wherein the identifier distinguishes the volume identifier from other volume identifiers for the identified aircraft electronic model, and wherein the volume descriptor describes the volume identified by the identifier in the identified aircraft electronic model;
   displaying the selected section in the second graphical user interface using the volume in the aircraft electronic model identified for the section selected; and
   managing assembly of the aircraft based on the selected section displayed.

2. The method of claim 1, wherein the volume is identified from a sectional view of the aircraft and volume identifiers for the sectional view.

3. The method of claim 2, wherein at least one volume identifier in the volume identifiers comprises a group of coordinates defining the volume in the aircraft electronic model.

4. The method of claim 3, wherein the section has a hotspot associated with the volume identifier.

5. The method of claim 1, wherein the sections are displayed in an exploded view.

6. The method of claim 1, wherein the sections are displayed in a sectional view of the aircraft.

7. The method of claim 1, wherein displaying comprises displaying a group of buildings in a manufacturing facility; and wherein identifying the aircraft electronic model comprises identifying the aircraft electronic model for the aircraft from a selection of a building in the group of buildings in the manufacturing facility.

8. The method of claim 1 further comprising:
   displaying positions for assembly of the aircraft; and
   identifying the sections of the aircraft from a selection of a position of the aircraft from the positions displayed.

9. The method of claim 8, wherein the sections of the aircraft in the position are the sections manufactured at the position selected.

10. An apparatus comprising:
    a display device configured to display a first graphical user interface including a visual map of a plurality of locations where one or more aircraft are assembled in a building;
    a processor configured to receive a selection of a location from among said plurality of locations on the visual map;
    an object manager, executed by the processor, configured to:
    identify an aircraft electronic model associated with a corresponding location on the visual map based on the selection being associated with selecting a location out of the plurality of locations in the building;
    display sections of the identified aircraft electronic model in a second graphical user interface different from the first graphical user interface, wherein the displayed sections correspond to aircraft sections that are available for assembly at the selected location on the visual map, and wherein the sections are selectable;
    detect a selection of a section from the sections displayed in the second graphical user interface;
    identify in the first graphical user interface, using a volume identifier, a volume in the identified aircraft electronic model corresponding to the section selected from the sections displayed, wherein the volume identifier identifies the volume in the identified aircraft electronic model by using an identifier and a volume descriptor to specify the volume, wherein the identifier distinguishes the volume identifier from other volume identifiers for the identified aircraft electronic model, and wherein the volume descriptor describes the volume identified by the identifier in the identified aircraft electronic model; and display the selected section in the second graphical user interface using the volume in the aircraft electronic model identified for the section selected; and an apparatus configured to manage assembly of the aircraft based on the selected section displayed.

11. The apparatus of claim 10, wherein the volume is identified from a sectional view of the aircraft and volume identifiers for the sectional view.

12. The apparatus of claim 11, wherein a volume identifier in the volume identifiers comprises a group of coordinates defining the volume in the aircraft electronic model.

13. The apparatus of claim 12, wherein the section has a hotspot associated with the volume identifier.

14. The apparatus of claim 10, wherein the sections are displayed in an exploded view.

15. A manufacturing system comprising:
manufacturing equipment configured to manufacture an aircraft;
a control system configured to control manufacturing of the aircraft;
a display device in the control system configured to display a first graphical user interface including a visual map of a plurality of locations where one or more aircraft are assembled in a building; and
a processor in the control system, the processor configured to:
receive a selection of a location from among said plurality of locations on the visual map;
identify an aircraft electronic model associated with a corresponding location on the visual map based on the selection being associated with selecting a location out of the plurality of locations in the building;
display sections of the identified aircraft electronic model in a second graphical user interface different from the first graphical user interface, wherein the displayed sections correspond to aircraft sections that are available for assembly at the selected location on the visual map, and wherein the sections are selectable;
detect a selection of a section from the sections displayed in the second graphical user interface;
identify in the first graphical user interface, using a volume identifier, a volume in the identified aircraft electronic model corresponding to the section selected from the sections displayed, wherein the volume identifier identifies the volume in the identified aircraft electronic model by using an identifier and a volume descriptor to specify the volume, wherein the identifier distinguishes the volume identifier from other volume identifiers for the identified aircraft electronic model, and wherein the volume descriptor describes the volume identified by the identifier in the identified aircraft electronic model; and
display the selected section in the second graphical user interface using the volume in the aircraft electronic model identified for the section selected; and
manage, using the manufacturing equipment, assembly of the aircraft based on the selected section displayed.

* * * * *